United States Patent [19]
Kudo et al.

[11] Patent Number: 5,861,645
[45] Date of Patent: Jan. 19, 1999

[54] AMPLIFYING TYPE SOLID-STATE IMAGING DEVICE AND AMPLIFYING TYPE SOLID-STATE IMAGING APPARATUS

[75] Inventors: Hiroaki Kudo, Nara; Takashi Watanabe, Soraku-gun, both of Japan

[73] Assignee: Sharp Kabushiki Kaisha, Osaka, Japan

[21] Appl. No.: 820,800

[22] Filed: Feb. 4, 1997

[30] Foreign Application Priority Data

Feb. 5, 1996 [JP] Japan ..................... 8-019199

[51] Int. Cl.$^6$ ................. H01L 31/113; H01L 27/146
[52] U.S. Cl. .................. 257/291; 257/445; 257/448
[58] Field of Search ........................ 257/290, 291, 257/443, 445, 448

[56] References Cited

U.S. PATENT DOCUMENTS

| | | | |
|---|---|---|---|
| 4,589,027 | 5/1986 | Nakamura et al. | 257/291 |
| 4,857,981 | 8/1989 | Matsumoto et al. | 257/291 |
| 4,929,994 | 5/1990 | Matsumoto | 257/291 |
| 5,172,249 | 12/1992 | Hashimoto | 358/482 |
| 5,285,091 | 2/1994 | Hamasaki | 257/292 |
| 5,317,174 | 5/1994 | Hynecek | 257/222 |
| 5,430,312 | 7/1995 | Yamada | 257/291 |
| 5,486,711 | 1/1996 | Ishida | 257/291 |

FOREIGN PATENT DOCUMENTS 2 291 256   1/1996   United Kingdom .

OTHER PUBLICATIONS

J. Hynecek, *A New Device Architecture Suitable for High–Resolution and High–Performance Image Sensors*, IEEE Transactions on Electron Devices, vol. 35, No. 5, May 1988, pp. 646–652.

K. Matsumoto, et al., *The Operation Mechanism of a Charge Modulation Device (CMD) Image Sensor*, IEEE Transactions on Electron Devices, vol. 38. No. 5, May 1991, pp. 989–998.

J. Hynecek, *BCMD—An Improved Photosite Structure for High–Density Image Sensors*, IEEE Transactions on Electron Devices, vol. 35, No. 5, May 1991, pp. 1011–1020.

E. Fossum, *CMOS Image Sensors: Electronic Camera on a Chip*, IEDM, 1995, pp. 17–25.

*Primary Examiner*—Gene M. Munson
*Attorney, Agent, or Firm*—Dike, Bronstein, Roberts & Cushman; David G. Conlin; Brian L. Michaelis

[57] ABSTRACT

An amplifying type solid-state imaging device having a transistor formed on a semiconductor base and a charge release portion which stores a signal charge which is generated by light incident on the transistor and outputs a change of an electrical signal in accordance with the stored charge. The transistor includes: a first gate region including a portion for storing the signal charge therein and a first gate electrode formed on the semiconductor base surface; and a source and a drain formed of impurity layers of a higher concentration than the semiconductor base concentration. The charge release portion includes: a second gate region including a portion in the vicinity of the semiconductor base surface, and a second gate electrode formed via an insulating film on the semiconductor base surface; and a drain for charge discharge formed of an impurity layer of a higher concentration than the semiconductor base concentration. The stored signal charge is released to the drain for charge discharge of the charge release portion.

10 Claims, 17 Drawing Sheets

FIG. 2A  During signal storage
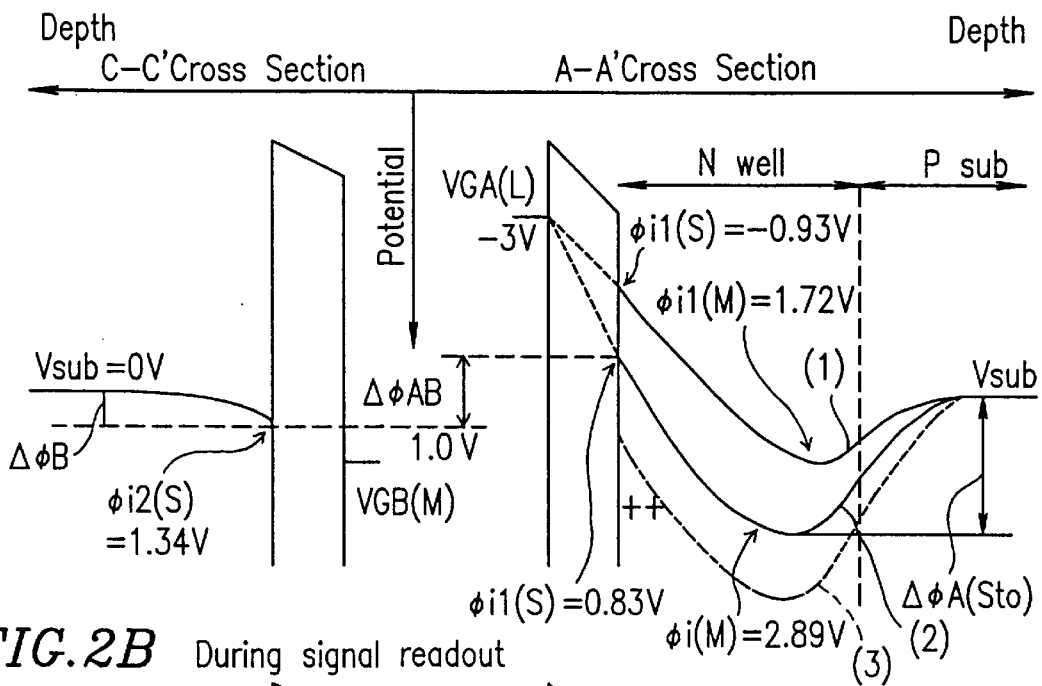
FIG. 2B  During signal readout
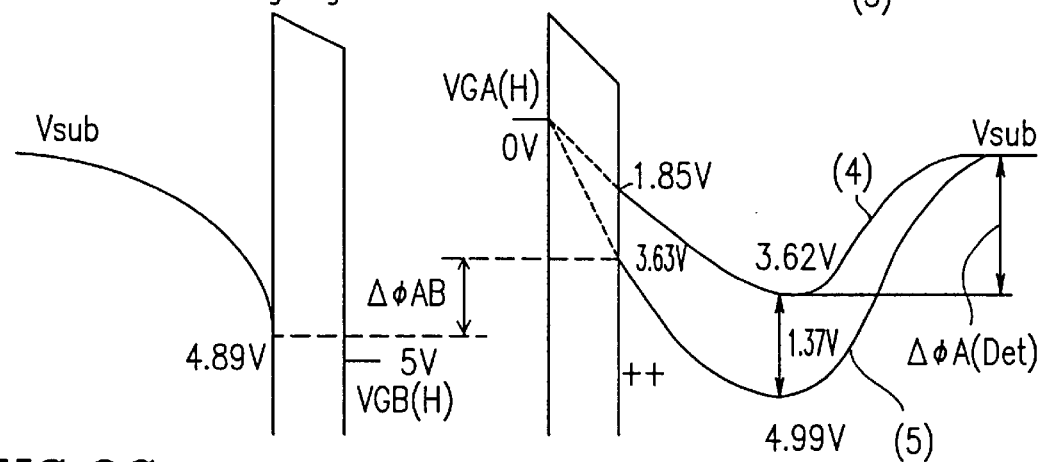
FIG. 2C  During reset
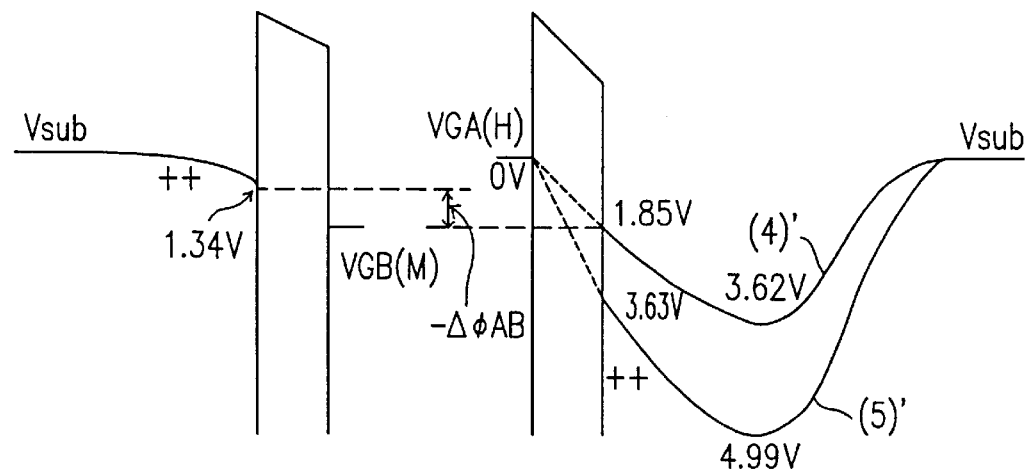

FIG. 6A During signal storage
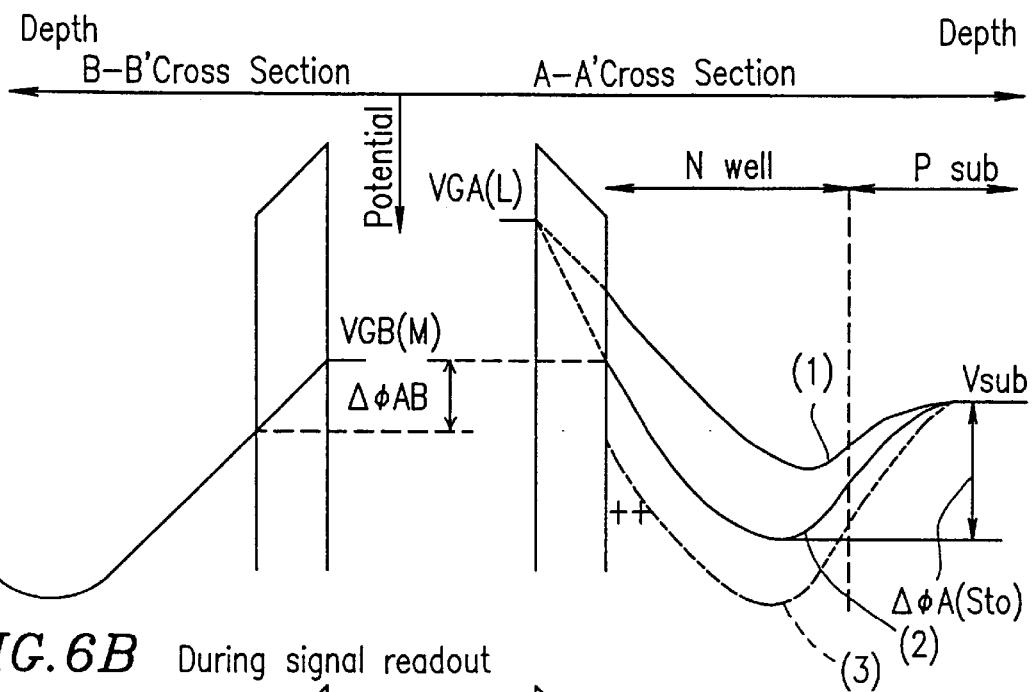
FIG. 6B During signal readout
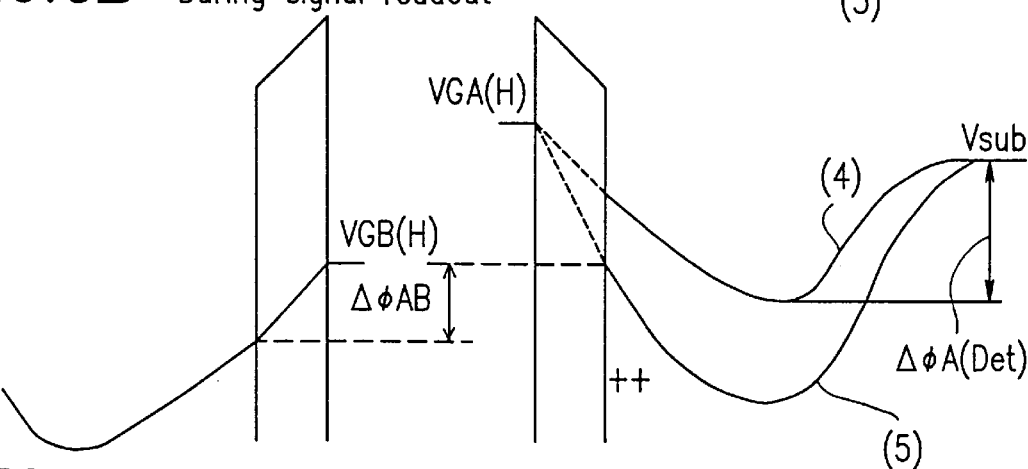
FIG. 6C During reset
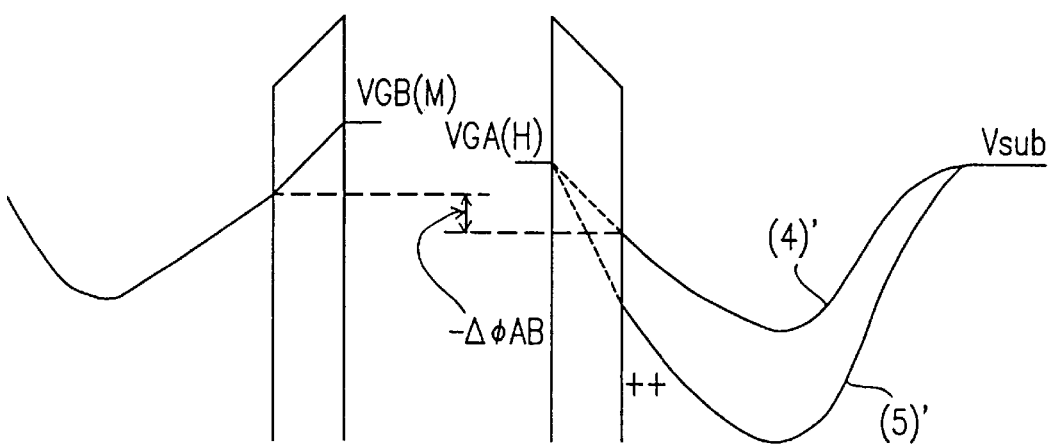

FIG. 9A   During signal storage
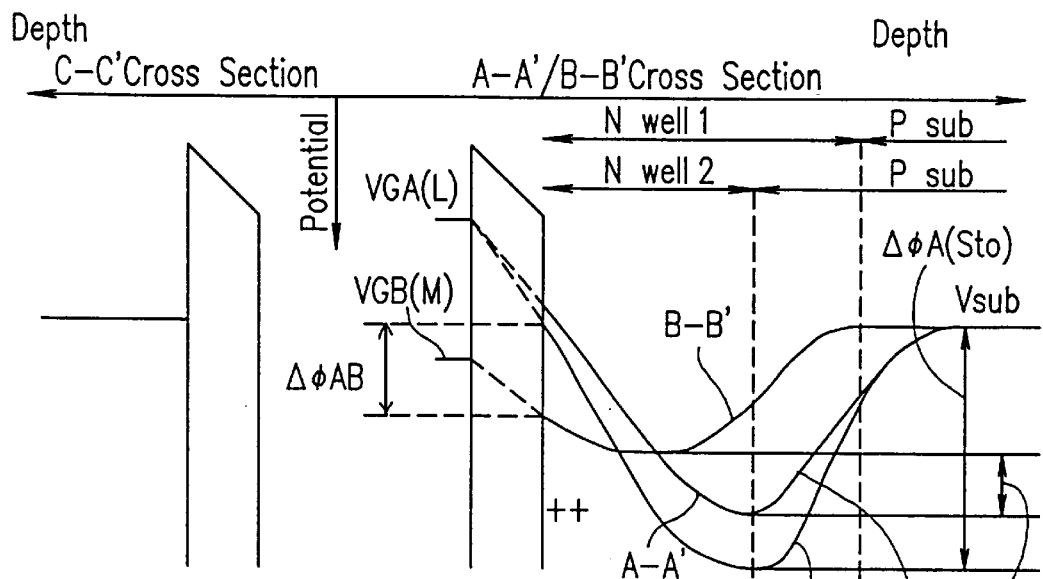
FIG. 9B   During signal readout
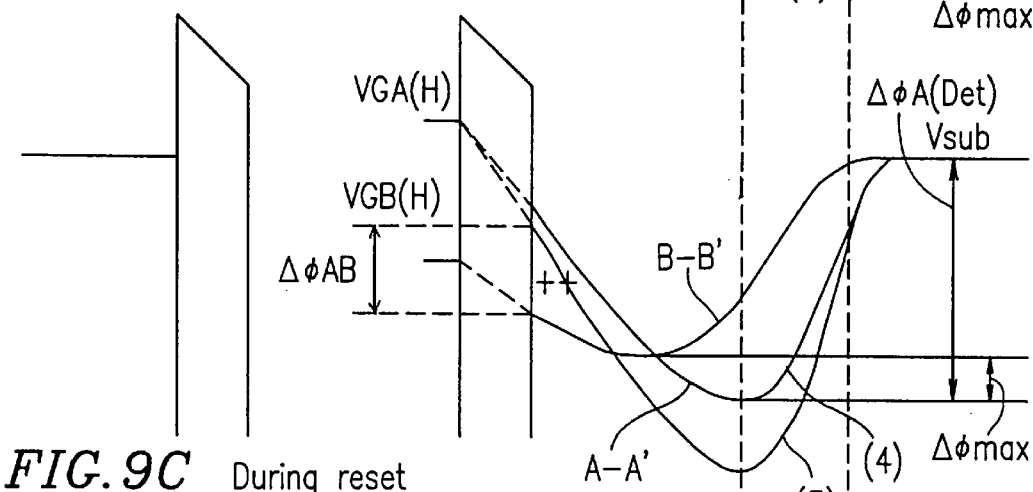
FIG. 9C   During reset
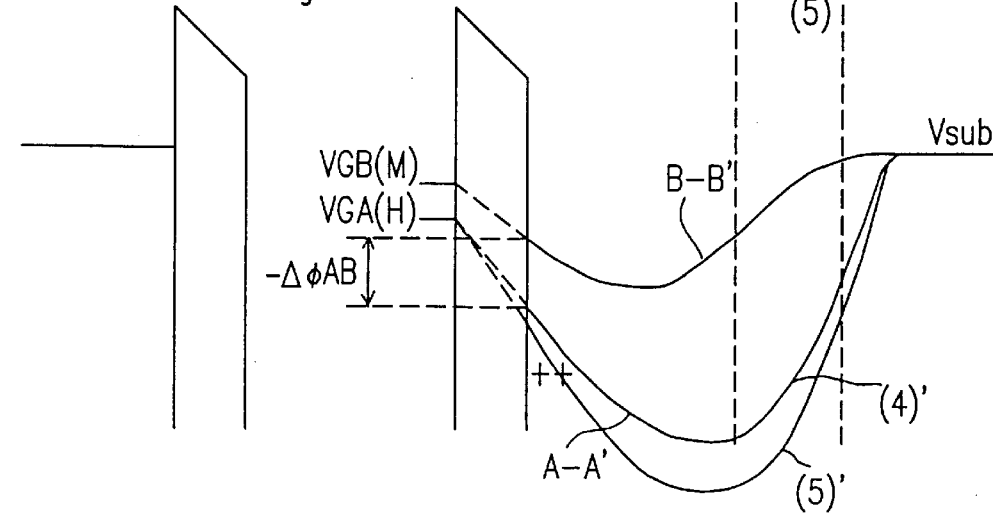

FIG. 11A  During signal storage
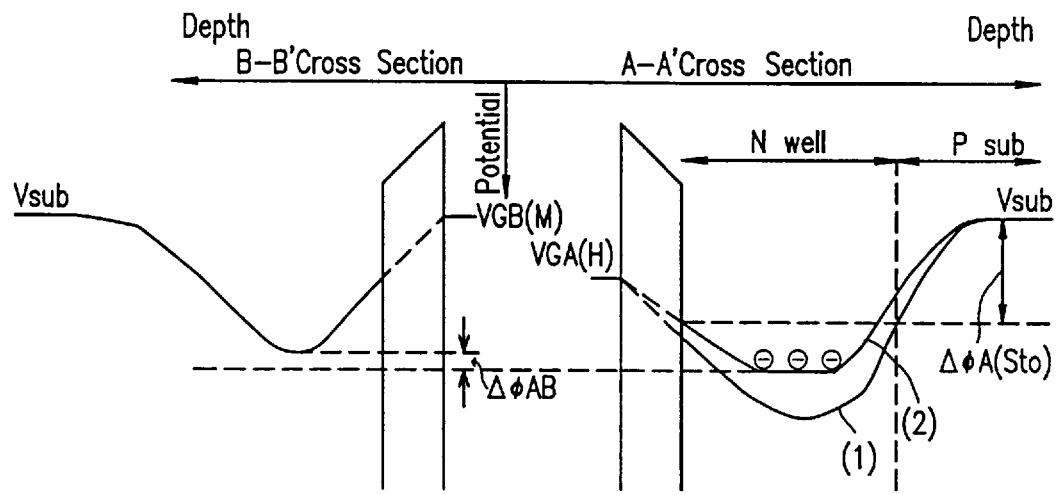
FIG. 11B  During signal readout
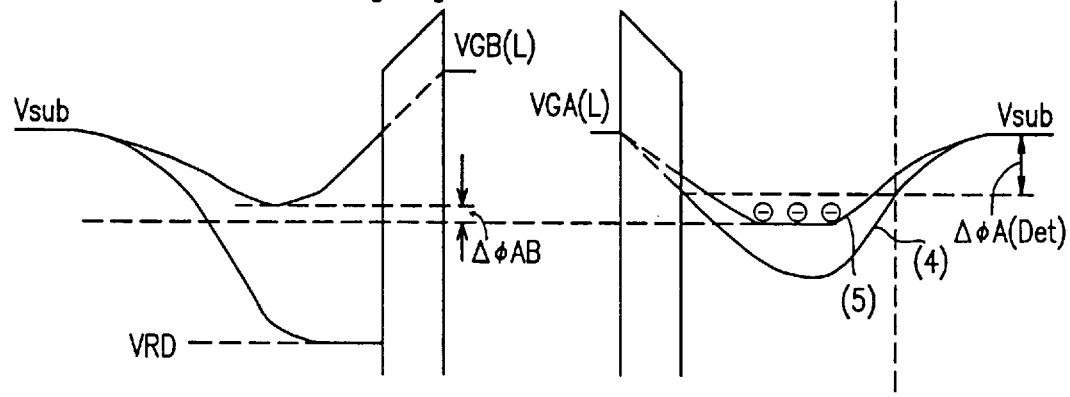
FIG. 11C  During reset
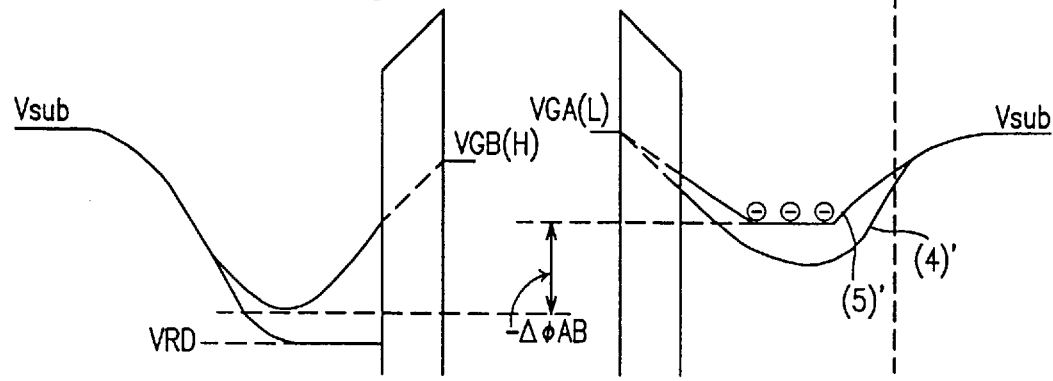

FIG. 16A During signal storage
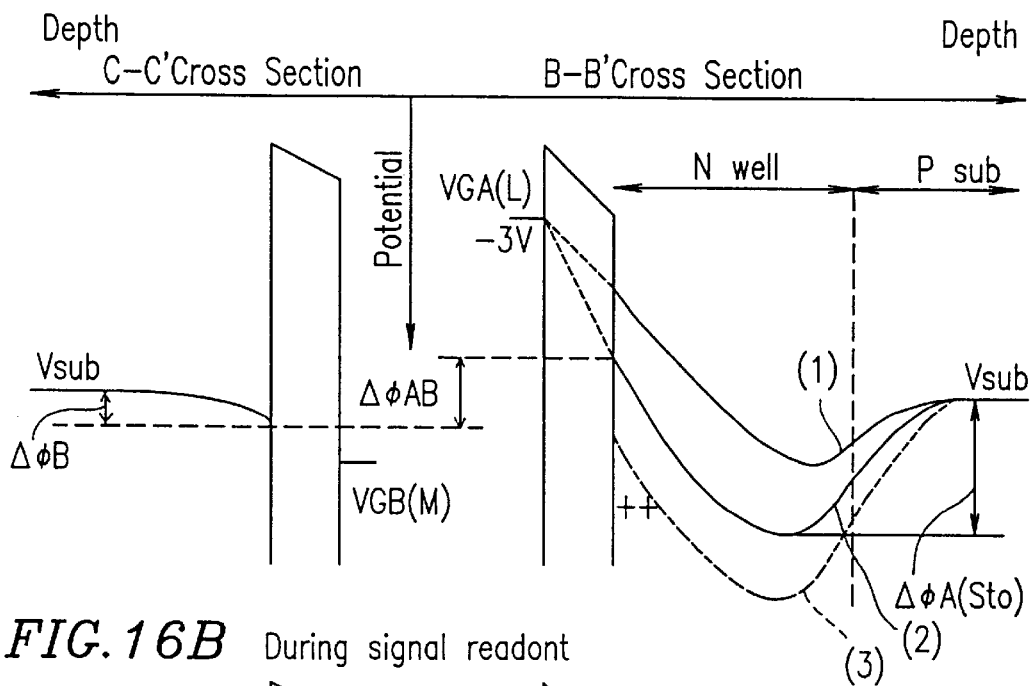
FIG. 16B During signal readont
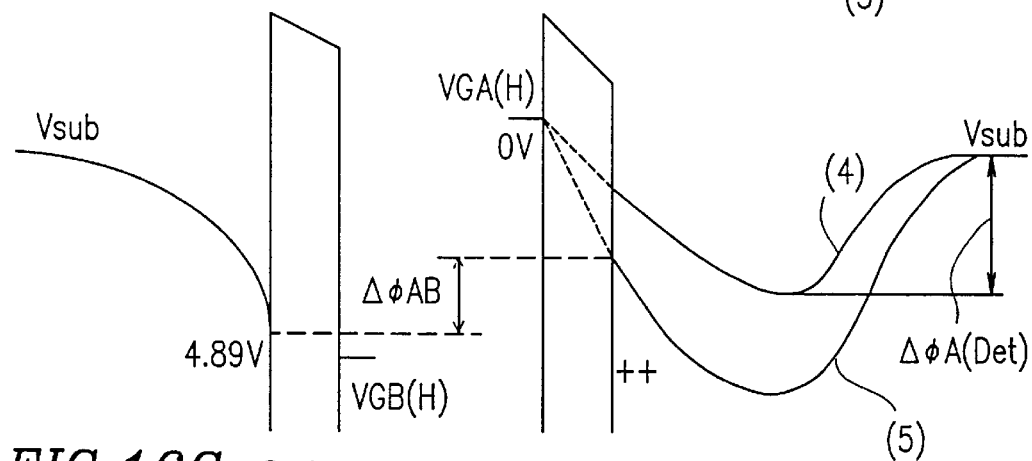
FIG. 16C During reset
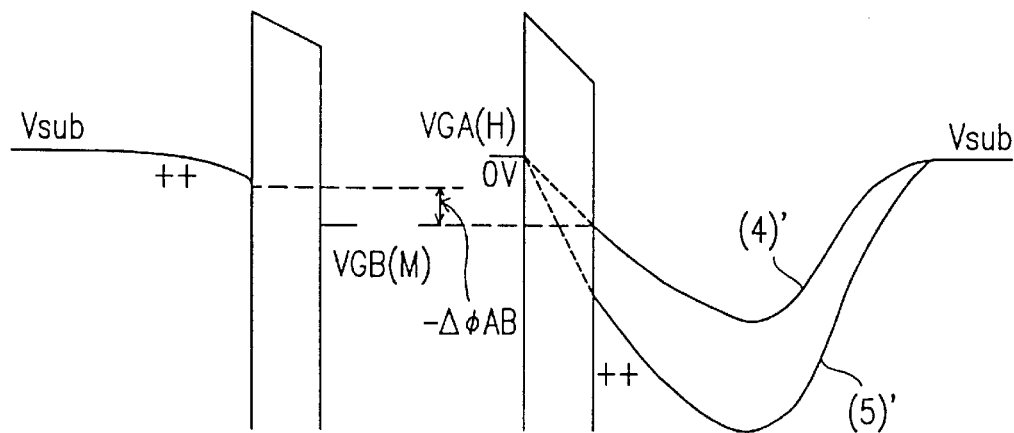

AMPLIFYING TYPE SOLID-STATE IMAGING DEVICE AND AMPLIFYING TYPE SOLID-STATE IMAGING APPARATUS

BACKGROUND OF THE INVENTION

1. Field of the Invention

The present invention relates to an amplifying type solid-state imaging device and an amplifying type solid-state imaging apparatus including an amplifying type solid-state imaging device. More specifically, the present invention relates to a compact amplifying type solid-state imaging device capable of including an increased number of pixels, and an amplifying type solid-state imaging apparatus utilizing such an amplifying type solid-state imaging device.

2. Description of the Related Art

Currently, the mainstream of the solid-state imaging apparatus is a charge coupled device (hereinafter, referred to as CCD), which is extensively utilized in a variety of fields. In the CCD type imaging apparatus, incident light is photoelectrically converted in a photodiode or a MOS diode. A stored signal charge is transferred to a high sensitive charge release section via a CCD transfer channel, whereby the signal charge is converted into a voltage signal. This results in a high S/N ratio and a large output voltage.

In more recent years, a growing demand exists for a compact imaging apparatus and an increase in the number of pixels. To meet the demand, the size of a pixel must be scaled down. When the size of the pixel is reduced, however, the amount of charge which the CCD can transfer is small resulting in a lowered dynamic range. Furthermore, the increased number of pixels causes a greater power consumption due to the entire device being driven by several phases of clocks as in the case of the CCD.

Recently, to address these problems, an amplifying type solid-state imaging apparatus has been proposed. This apparatus includes a signal charge which is generated in a pixel and is read by a scanning circuit, after the signal charge is amplified in the pixel, without being read in the pixel. In accordance with an amplifying type solid-state imaging apparatus, because the signal charge is amplified, a limitation of the signal charge amount to be read out is eliminated, thus leading to an advantage over the CCD in terms of the dynamic range. Furthermore, it is sufficient to drive only horizontal and vertical line selection switches including signal readout pixels, and a voltage for when the driving is low. Therefore, the power consumption is smaller than that of the CCD.

In general, a transistor is used for amplifying a signal charge in a pixel, and the transistor is classified into an SIT type, a bipolar type and a MOS type.

With respect to the scanning circuit for the signal readout, the MOS type transistor is preferable because the structure of the MOS type transistor is simple and the production thereof is easy. When the MOS type transistor is used for amplifying a signal charge in the pixel, a monolithic apparatus can be produced, thus leading to structural advantages. Furthermore, a single MOS transistor in a pixel is advantageous for increasing the pixel density.

This type of amplifying type solid-state imaging apparatus includes, for example, a TGMIS (Twin Gate MOS Image Sensor) type. One example thereof was previously proposed by the-Applicant in Japanese Patent Application No. 6-148330 (corresponding to the copending U.S. application Ser. No. 08/382,257). FIGS. 15A and 15B show the prior art pixel structure thereof, namely, the structure of the amplifying type solid-state imaging device.

As shown in prior art FIG. 15B, a first gate electrode 2 and a second gate electrode 3 are formed on a p-type semiconductor substrate 1 via an insulating film. N-type well layers 4 are suitably spaced in a horizontal direction on surface portions of the semiconductor substrate 1 and below the first gate electrode 2. $N^+$ diffused layers are suitably spaced on surface portions of the well layers 4. One of the pairs of the $n^+$ diffused layers constitutes a source 5 of a MOS type transistor using the first gate electrode 2 as the gate thereof, and the other $n^+$ diffused layer constitutes a drain 6.

In the amplifying type solid-state imaging device having such a structure, incident light hυ which has penetrated the first gate electrode 2 generates electron-hole pairs by photoelectric conversion, such that electrons drift to the drain 6. On the other hand, the holes are confined in a potential barrier formed in an intermediate region of the well layer 4 and a potential barrier below the second gate electrode 3, and stored at the semiconductor/insulating film interface of the well layer 4 so as to become signal chargers.

The amount by which the potential of the well layer 4 is varied depends on the stored signal charge amount, which is read out as an amplified electric potential variation in the source 5, and used as an output signal.

The release of the signal charge is readily achieved by lowering the potential barrier below the second gate electrode 3 so that the signal charge drifts to the semiconductor substrate 1 along the path shown by the arrow in FIG. 15B. More specifically, the holes stored as the signal charges flow from the surface region of the well layer 4 to the semiconductor substrate 1, and thus the signal charges are reset. In the present specification, the release of the once stored signal charges is referred to as 'a reset operation'.

Next, the operations during signal charge storage, signal readout and release of the signal charges will be described in details with reference to FIGS. 16A, 16B and 16C. Herein, the right side of each of FIGS. 16A, 16B and 16C shows a depth direction potential distribution below the first gate electrode 2, and the left side of each of FIGS. 16A, 16B and 16C shows a depth direction potential distribution below the second gate electrode 3.

First, the operation during the signal charge storage will be described with reference to FIG. 16A.

A low voltage VGA(L) is applied to the first gate electrode 2, and a medium voltage VGB(M) is applied to the second gate electrode 3. Thus, a potential barrier $\Delta\phi B$ of a predetermined value or more when against holes, is formed below the second gate electrode 3. The potential barrier prevents the holes from flowing from the semiconductor substrate 1 to the surface of the well layer 4. The value of the potential barrier $\Delta\phi B$ is about ~0.5 V (i.e., a value lower than and close to 0.5 V) in the case where the semiconductor substrate 1 is silicon. The description below will be limited to the case where the substrate is silicon.

The holes generated by photoelectric conversion are stored on the surface of the well layer 4 as signal charges, and the potential distribution on the surface of the well layer 4 is raised from state (1) to state (2). During the period when a difference $\Delta\phi AB$ between the surface potential of the well layer 4 and the surface potential below the second gate electrode 3 is large (ie., $\Delta\phi AB>0.5$ V), the signal charges stay on the surface. However, when the signal charges continue to be stored, the potential distribution is further raised and reaches the storage limitation state as shown in state (3). In this storage limitation state, $\Delta\phi AB$ is smaller than ~0.5 V, so that the stored holes jump the potential barrier below the second gate electrode 3 and flow to the semiconductor substrate 1. Thus, excess charge can overflow, thereby making it possible to prevent blooming . Herein, the potential depth of the n-type well layer in the state (2) is designated as ΔφA(Sto).

Next, the operation during signal readout will be described with reference to FIG. 16B.

A high voltage VGA(H) is applied to the first gate electrode 2. Thus, a potential distribution below the first gate electrode 2 is further raised. When there is no signal charge, the potential distribution is in the state (4). When signals are being stored, the potential distribution is in the state (5), The potential depth of the n-type well layer in the state (4) is designated as ΔφA(Det). Herein, the value of VGA(H) is selected so as to satisfy an inequality ΔφA(Det)>ΔφA(Sto).

On the other hand, a high voltage VGB(H) is applied to the second gate electrode 3. Thus, a potential barrier higher than the surface potential of the well layer 4 during the signal storage by ΔφAB (>0.5 V) (in the state (5)) is formed below the second gate electrode 3. The high potential barrier prevents the signal storage charges from flowing from the surface of the well layer 4 to the semiconductor substrate 1.

When the value of VGA(H) is set so as to satisfy the requirement of ΔφA(Det)>ΔφA(Sto), the signal readout of a selected pixel is only performed for the following reason. Even if a source terminal VS (as shown in FIG. 15A) is connected to a plurality of common pixels, a VGA(H) is applied to a specific gate and VGA(L) is applied to other gates, and the inequality of ΔφA(Det)>ΔφA(Sto) is satisfied, the source electric potential to be detected is defined by the value of the source terminal corresponding to the VGA(H) gate.

Next, the operation during reset will be described with reference to FIG. 16C.

A high voltage such as VGA(H) in the signal readout, is applied to the first gate electrode 2, and a medium voltage, such as VGB(M) in signal storage, is applied to the second gate electrode 3. At this point, the potential below the second gate electrode 3 is a value (−ΔφAB) sufficiently lower than the surface potential of the well layer 4 when there is no signal charge (i.e, in the state (4)'). For this reason, all signal charges, i.e., holes on the surface of the well layer 4, pass below the second gate electrode 3 and are released to the semiconductor substrate 1. In other words, a reset operation is performed. Thus, once image information is cleared, an operation of storing subsequent image information can be performed. Furthermore, when the reset operation is performed in the middle of the period during optical integration, the image information prior thereto is cleared, and the information after that point is stored, Thus, a so-called 'shuttering operation' can be performed.

However, in the TGMIS amplifying type solid-state imaging apparatus having the structure shown in FIGS. 15A and 15B, when a pixel area is reduced for the purpose of increasing pixel density, the following problems arise. The problems will be described with reference to FIGS. 17A and 17B. FIG. 17A is a cross sectional view similar to FIG. 15B. FIG. 17B shows a depth direction potential distribution below the first gate electrode 2 and a depth direction potential distribution below the second gate electrode 3 during the reset operation.

To increase the pixel density and reduce the pixel area, and to realize a further increase in the number of pixels and further compactness in the amplifying type solid-state imaging device used in the above-mentioned TGMIS amplifying type solid-state imaging apparatus, it is necessary to further reduce the width of the second gate electrode 3 and a space between a source 5 where an output signal is detected and a drain 6.

However, when the sizes thereof are reduced to some extent, a three-dimensional potential ridge 7 is formed in the path through which the stored charges are released by an electric field which is generated by an electric potential applied to the source 5 and the drain 6. For this reason, even if the surface potential barrier below the second gate electrode 3 is lower than the surface potential below the first gate electrode 2, as shown on the left side of the FIG. 17B, the potential ridge 7 is formed in the intermediate portion between the surface of the bulk of the potential distribution below the second gate electrode 3 and the semiconductor substrate 1. Therefore, the holes which are stored as signal charges cannot flow anywhere. As a result, the stored signal charges cannot be completely released to the semiconductor substrate 1.

In order to prevent the potential ridge 7 from being formed, when the electric potential of the source 5 and the drain 6 is set at 5 V, the width of the second gate electrode 3 can be set at, for example, 3.5 μm or more. However, when the width of the second gate electrode 3 is set at this, it is difficult to realize high pixel density and miniaturization of the apparatus. For this reason, according to the amplifying type solid-state imaging device having the structure shown in FIGS. 15A and 15B, the attempt for the high pixel density and miniaturization of the solid-state apparatus was subjected to some constraints.

SUMMARY OF THE INVENTION

According to one aspect of the present invention, an amplifying type solid-state imaging device for storing a signal charge which is generated by light incident on a transistor formed on the surface of the semiconductor base in the vicinity of the surface of the semiconductor base in the transistor, and for outputting an electrical signal change in accordance with the stored signal charge, the device includes: a transistor including a first gate region including a portion in the vicinity of the semiconductor base surface where the signal charge is stored and a first gate electrode formed on the semiconductor base surface, and a source and a drain which are formed of impurity layers of a higher concentration than the semiconductor base concentration on the semiconductor base surface; and a charge release portion including a second gate region including the portion in the vicinity of the semiconductor base surf ace a part of which is adjacent to the first gate region, and a second gate electrode formed via an insulating film on the semiconductor base surface, a part of which is adjacent to the first gate electrode, and a drain for charge discharge formed of an impurity layer of a higher concentration than the semiconductor base concentration in a portion having a predetermined distance along the direction of the semiconductor base surface, from a portion adjacent to the first gate electrode and the second gate electrode on the semiconductor base surface, wherein the stored signal charge is released to the drain for charge discharge of the charge release portion.

In one embodiment of the invention, the semiconductor base includes a semiconductor substrate having a first conductivity and a semiconductor well layer having a second conductivity formed on a part of the surface of the semiconductor substrate having the first conductivity. The source and the drain having the second conductivity are formed of the impurity layers of a higher concentration than the semiconductor well layer having the second conductivity within the semiconductor well layer having the second conductivity. The first gate electrode is formed between the source and the drain on the semiconductor well layer having the second conductivity. The second gate electrode is formed on the semiconductor substrate having the first conductivity and on a portion where the semiconductor well layer having the second conductivity is not formed, adjacent to the first gate electrode. The charge discharge drain formed of a high concentration impurity layer having the first conductivity is formed on the semiconductor substrate surface having the first conductivity.

In another embodiment of the invention, the semiconductor base includes a semiconductor substrate having a first conductivity and a semiconductor layer having a second conductivity formed on the semiconductor substrate having the first conductivity. The source and the drain are formed of high concentration impurity layers having the second conductivity on the semiconductor layer having the second conductivity. The first gate electrode is formed between the source and the drain on the semiconductor layer having the second conductivity. A semiconductor well layer having the first conductivity is formed between the source and the drain on a portion adjacent to the first gate region on the surface of the semiconductor layer having the second conductivity. The second gate electrode is formed on the semiconductor well layer having the first conductivity, adjacent to the first gate electrode. The drain for charge discharge is formed on the semiconductor well layer surface having the first conductivity.

In still another embodiment of the invention, the semiconductor base includes a semiconductor substrate having a first conductivity and a semiconductor layer having a second conductivity formed on the semiconductor substrate having the first conductivity. The source and the drain are formed of high concentration impurity layers having the second conductivity on the semiconductor layer having the second conductivity. The first gate electrode is formed between the source and the drain on the semiconductor layer having the second conductivity. The second gate electrode is formed on the semiconductor layer having the second conductivity, adjacent to the first gate electrode. The drain for charge discharge is formed on the semiconductor layer surface having the second conductivity.

In still another embodiment of the invention, the semiconductor base includes a semiconductor substrate having a first conductivity and a semiconductor layer having a second conductivity formed on the semiconductor substrate having the first conductivity, The source and the drain are formed of high concentration impurity layers having the first conductivity on the semiconductor layer having the second conductivity. The first gate electrode constituting the gate region where a signal charge generated by incident light is stored is formed in a portion in the vicinity of the surface of the semiconductor layer having the second conductivity between the source and the drain. The second gate electrode is formed on the semiconductor layer having the second conductivity, adjacent to the first gate electrode. The drain for charge discharge is formed of an impurity layer having the second conductivity on the semiconductor layer surface having the second conductivity.

In still another embodiment of the invention, when the first and the second gate electrodes are formed via a gate insulating film, and a voltage applied to the first gate electrode is equal to a voltage applied to the second gate electrode, at least one of the thicknesses of the semiconductor well layer having the second conductivity or the semiconductor layer having the second conductivity, a carrier concentration distribution of the semiconductor well layer having the second conductivity or the semiconductor layer having the second conductivity, and a thickness of the gate insulating film differs between the first gate region and the second gate region so that a base surface potential in the first gate region is smaller than the base surface potential in the second gate region, and the largest potential in the potential profile of the first gate region is lager than the largest potential in the potential profile of the second gate region.

In still another embodiment of the invention, an electrical potential of the semiconductor base is controlled independently of the electrical potential of the drain for charge discharge.

In still another embodiment of the invention, the first gate region is surrounded by the drain and the second gate region, and the source is surrounded by the first gate region.

According to another aspect of the present invention, an amplifying type solid-state imaging apparatus includes the amplifying type solid-state imaging device mentioned above, wherein the first gate electrode is connected to a first clock line while the second gate electrode is connected to a second clock line, the drain of the transistor is connected to a first power source in common to each imaging device while the drain for charge discharge is connected to a second power source in common to each imaging device, and the source of the transistor is connected to a signal line, wherein the apparatus is a one-dimensional or two-dimensional imaging apparatus.

According to still another aspect of the present invention, an amplifying type solid-state imaging apparatus includes the amplifying type solid-state imaging device mentioned above, wherein the drain and the second gate region function as a device isolation region with respect to a signal charge.

With such a drain for charge discharge provided, when the potential barrier of the second gate region is lowered, even if the potential ridge is formed between the surface of the semiconductor base of the second gate region and the intermediate portion of the depth direction upon application of an electric potential to the source and the drain, a surface reset channel is formed on the surface of the semiconductor base. Therefore, the signal charges stored in the first gate region are released to the drain for charge discharge via the second gate region. In other words, according to such a structure, the reset operation can be performed.

Furthermore, during signal charge storage, the potential barrier of the second gate region is appropriately set, so that excess signal charge can be released to the drain for charge discharge. Therefore, blooming can be prevented.

Furthermore, in one embodiment, electrons function as signal charges, so that a photoelectric conversion region can be large, compared to the case where holes are signal charges, thus leading to a large dynamic range and improved characteristics of the amplifying type solid-state imaging device.

Furthermore, in the case where the potential distribution of the first gate region is different from that of the second gate region, a photoelectric conversion region can be large such that an arbitrary wavelength sensitivity characteristic can be obtained in the first gate region which is the photoelectric conversion region. This makes it possible to set an arbitrary amount of signal charges which can be stored in the second gate region, which defines the dynamic range. Therefore, a desired dynamic range can be readily set, thus leading to the advantage of improved characteristics of the amplifying type solid-state imaging device.

Furthermore, according to the structure where the electric potential of the semiconductor base and the electric potential of the drain for charge discharge can be independently controlled, the electric field intensity between the first gate region which is a charge storage region and the drain for charge discharge can be arbitrarily controlled. The field formation allows the signal charges to be released to the drain for charge discharge at a higher speed. Therefore, when such an amplifying type solid-state imaging device is used in a solid-state imaging apparatus, a signal output rate per frame can be improved. As a result, a high performance solid-state imaging apparatus can be realized. Furthermore, since it is possible to inject offset charges, fixed pattern noises (FPN) can be advantageously reduced. A more detailed explanation will be described below.

Thus, the invention described herein makes possible the advantages of providing an amplifying type solid-state imaging device capable of realizing further high pixel density and miniaturization, and an amplifying type solid-state imaging apparatus including the amplifying type solid-state imaging device.

This and other advantages of the present invention will become apparent to those skilled in the art upon reading and understanding the following detailed description with reference to the accompanying figures.

BRIEF DESCRIPTION OF THE DRAWINGS

FIG. 2A is a view illustrating a signal charge storage operation in the amplifying type solid-state imaging device according to Example 1.

FIG. 2B is a view illustrating a signal readout operation in the amplifying type solid-state imaging device according to Example 1.

FIG. 2C is a view illustrating a reset operation in the amplifying type solid-state imaging device according to Example 1.

FIG. 6A is a view illustrating a signal charge storage operation in the amplifying type solid-state imaging device according to Example 4.

FIG. 6B is a view illustrating a signal readout operation in the amplifying type solid-state imaging device according to Example 4.

FIG. 6C is a view illustrating a reset operation in the amplifying type solid-state imaging device according to Example 4.

FIG. 9A is a view illustrating a signal charge storage operation in the amplifying type solid-state imaging device according to Example 6.

FIG. 9B is a view illustrating a signal readout operation in the amplifying type solid-state imaging device according to Example 6.

FIG. 9C is a view illustrating a reset operation in the amplifying type solid-state imaging device according to Example 6.

FIG. 11A is a view illustrating a signal charge storage operation in the amplifying type solid-state imaging device according to Example 7.

FIG. 11B is a view illustrating a signal readout operation in the amplifying type solid-state imaging device according to Example 7.

FIG. 11C is a view illustrating a reset operation in the amplifying type solid-state imaging device according to Example 7.

FIG. 16A shows a signal charge storage operation of the TGMIS amplifying type solid-state imaging apparatus shown in FIGS. 15A and 15B.

FIG. 16B shows a signal readout operation of the TGMIS amplifying type solid-state imaging apparatus shown in FIGS. 15A and 15B.

FIG. 16C shows a reset operation of the TGMIS amplifying type solid-state imaging apparatus shown in FIGS. 15A and 15B.

DESCRIPTION OF THE PREFERRED EMBODIMENTS

Hereinafter, the present invention will be described by way of examples with reference to the accompanying drawings.

EXAMPLE 1

Figure 1A:
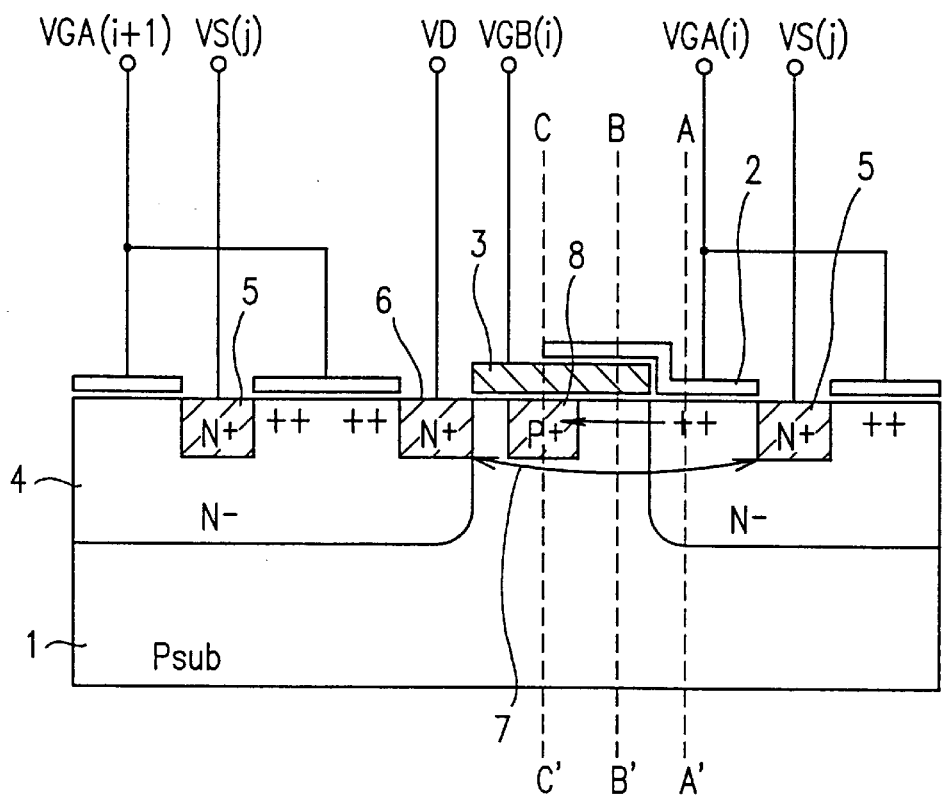
FIG. 1A is a cross sectional view of an amplifying type solid-state imaging device according to Example 1 of the present invention.
Figure 1B:
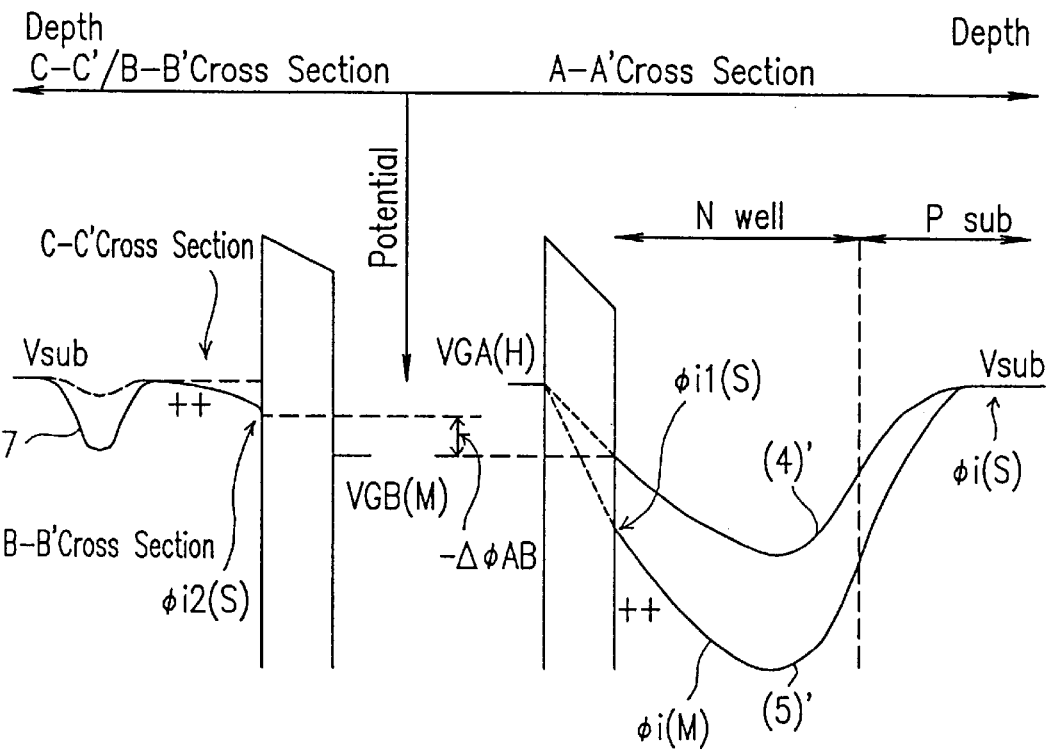
FIG. 1B shows a depth direction potential distribution for illustrating an operation during reset.

FIGS. 1A and 1B show an amplifying type solid-state imaging device according to Example 1 of the present invention. N-type semiconductor well layers 4 (well concentration: about $3.0 \times 10^{15}/cm^3$) are suitably spaced in a horizontal direction on the surface portion of a p-type semiconductor substrate 1 (substrate concentration: about $1.0 \times 10^{15}/cm^3$). A first gate electrode 2 ($n^+$ Poly Si: about 60 nm, oxide film thickness: about 80 nm), which functions as a first gate region, is formed on the semiconductor well layer 4. Furthermore, the $n^+$ diffused layer is formed on the surface portion of the well layers 4. The $n^+$ diffused layer constitutes a source 5 and a drain 6 of a MOS type transistor using the first gate electrode 2 as the gate thereof. A second gate Electrode 3 ($n^+$ Poly Si: about 450 nm, oxide film thickness: about 80 nm) which functions as a second gate region is formed above the semiconductor substrate 1 and between the semiconductor well layers 4. One side of the second gate electrode 3 is adjacent to the first gate electrode 2.

Furthermore, the region of a length $\Delta L \approx 1.0$ μm between the well layers 4 in the second gate region exists so that a potential barrier is formed by the second gate electrode 3. In the region, a reset drain 8 formed of a p-type low resistant diffused region is formed.

The reset drain 8 is formed before the second gate electrode 3 is formed. The $n^+$ diffused layers for the source 5 and the drain 6 are formed after the second gate electrode 3 is formed.

In such a structure, incident light hυ having penetrated the first gate electrode 2 generates electron-hole pairs by photoelectric conversion in the photoelectric conversion region of the well layer 4 causing electrons to drift to the drain 6. On the other hand, holes are confined in a potential barrier formed in an intermediate region of the well layer 4 and a potential barrier below the second gate electrode 3. The holes are stored at the semiconductor/insulating film interface in the first gate region so as to become signal charges.

Figure 15A:
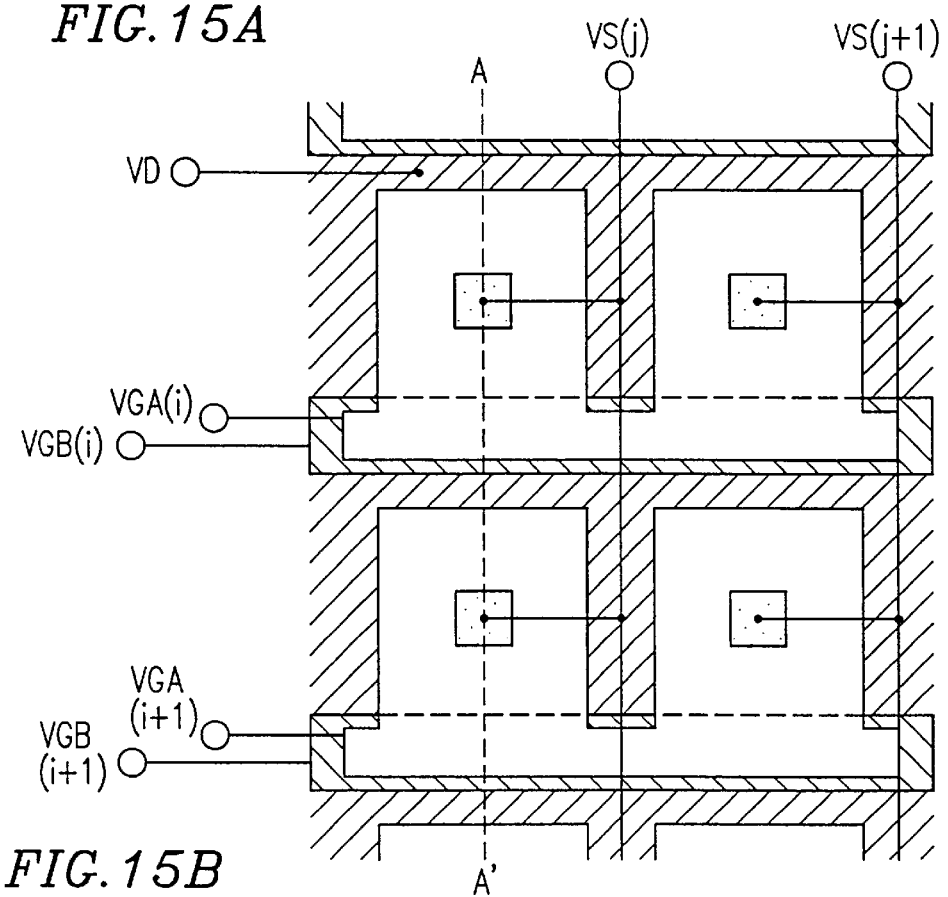
FIG. 15A is a plan view showing 4 pixels in a device in a TGMIS amplifying type solid-state imaging apparatus previously proposed by the Applicant in Japanese Patent Application No. 6-148330.
Figure 15B:
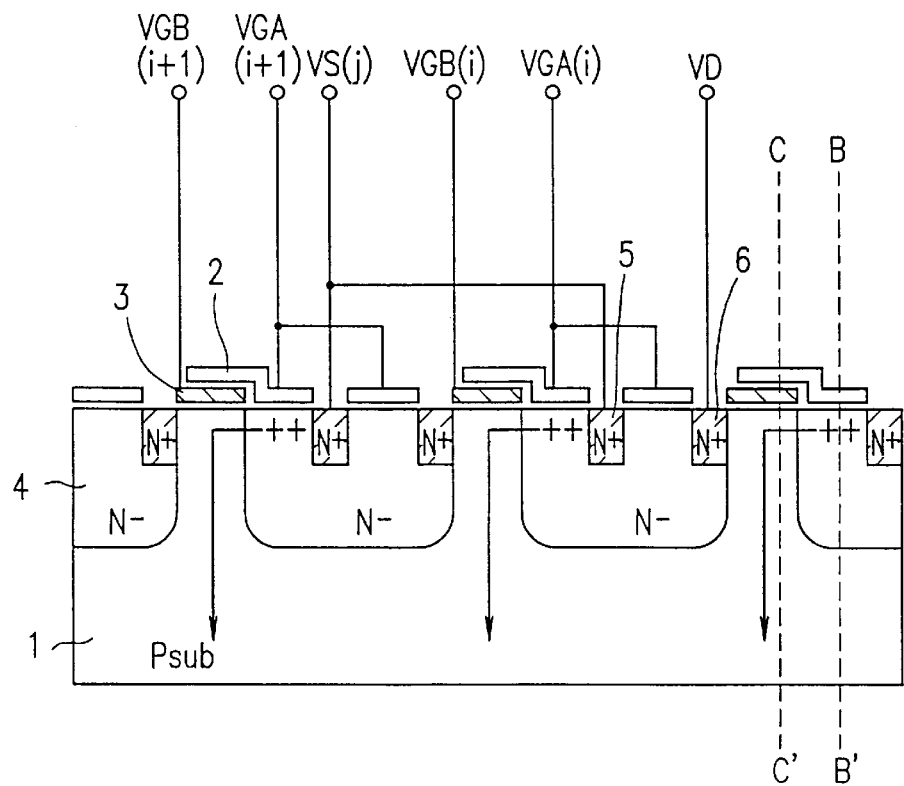
FIG. 15B is a cross sectional view taken at line A—A of the apparatus shown in FIG. 15A.
Figure 17A:
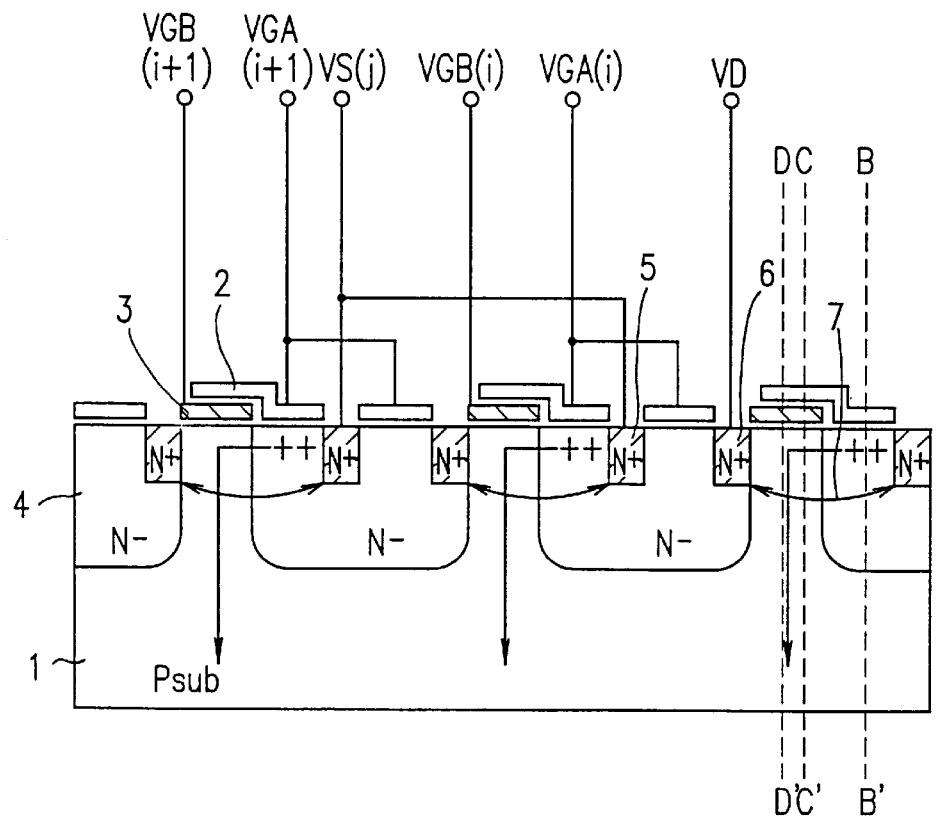
FIG. 17A is a cross sectional view of the device for illustrating problems of the TGMIS amplifying type solid-state imaging apparatus shown in FIGS. 15A and 15B.
Figure 17B:
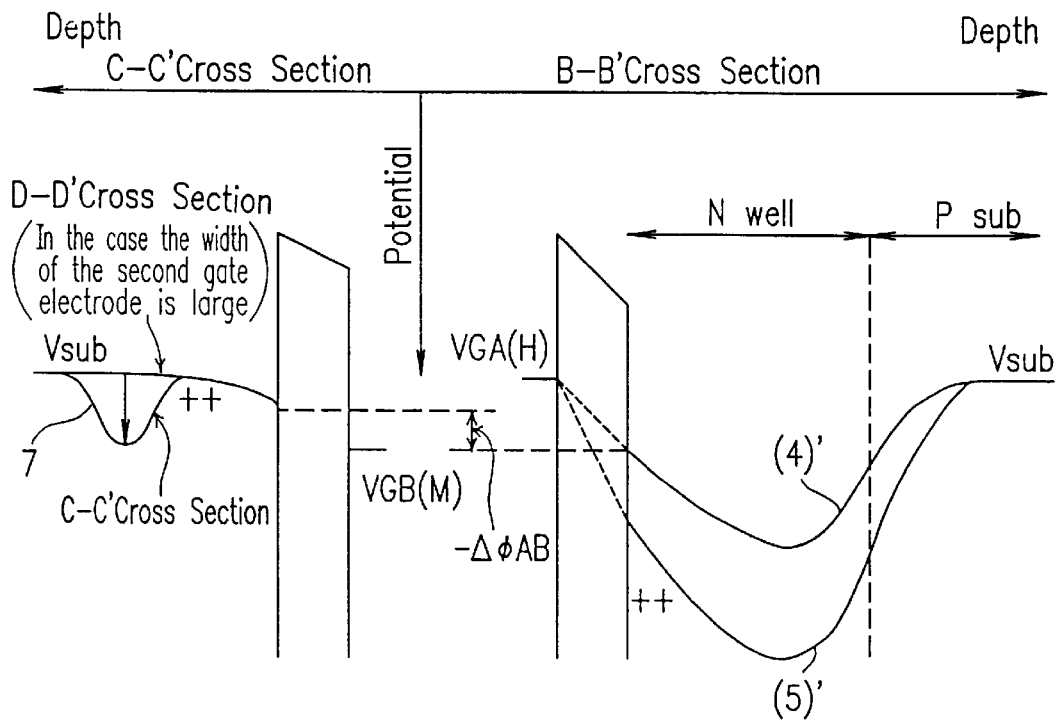
FIG. 17B shows a potential distribution during the reset operation for illustrating problems of the TGMIS amplifying type solid-state imaging apparatus shown in FIGS. 15A and 15B.

In the amplifying type solid-state imaging device of Example 1, as in the device shown in FIGS. 15A and 15B, the amount by which the potential of the semiconductor well layer 4 is varied, depending on the stored signal charge amount, is read out as an electric potential variation of the source 5, and used as an output signal. This variation exists for other solid-state imaging devices, as more fully described below in other examples.

The release of the signal charge is readily achieved by lowering the potential barrier below the second gate electrode 3 so that the signal charge drifts to the reset drain 8 along the path shown by the arrow in FIG. 1A. The signal charges which have flowed into the reset drain 8 are released outside of the substrate, for example, through lines (not shown).

According to the amplifying type solid-state imaging device of Example 1 used in the TGMIS type solid-state imaging apparatus, the reset operation can be performed in such a manner that stored charges are completely released without being subjected to the influence of the potential ridge 7, one of the described previously disadvantages of the prior art. The reason for this operation is as follows.

FIG. 1B shows the reset operation in greater detail. The storage operation and the readout operation are the same as those described above with reference to the prior art, so that the description thereof is omitted herein.

With respect to FIG. 1B, the right side of FIG. 1B shows a depth direction potential distribution below the first gate electrode 2. The left side of FIG. 1B shows a depth direction potential distribution of the region where the potential barrier is formed below the second gate electrode 3 and a depth direction potential distribution of the reset region 8 below the second gate electrode 3.

During the reset operation, a high voltage, such as the VGA(H) of the signal readout, is applied to the first gate electrode 2. A medium voltage, such as the VGB(M) of the signal storage, is applied to the second gate electrode 3. At this point, the surface potential below the second gate electrode 3 is a value ($-\Delta \phi AB$) sufficiently lower than the surface potential of the well layer 4 when there is no signal charge (i.e, in the state (4)'). For this reason, all signal charges, i.e., holes on the surface of the well layer 4 pass through the potential barrier gate below the second gate electrode 3 and flow into the reset drain 8. Thus, the reset operation is achieved.

More specifically, the amplifying type solid-state imaging device of Example 1 is not subjected to the influence of the potential ridge 7 which is formed in the intermediate portion of the depth direction below the second gate electrode 3, which is one of the problems in the prior art. This is because in Example 1, a surface channel, functioning as a release path for holes which are signal charges stored in the first gate region, is formed on the surface of the semiconductor substrate 1. A broken line on the left side of FIG. 1B shows the state where the potential barrier below the second gate electrode 3 is lowered.

As described above, according to Example 1, since the device is not subjected to the influence of the potential ridge 7, the size, such as the width of the second gate electrode 3, can be set without any limitations, and the two-dimentional design of components, such as a gate, can be performed with the increased freedom. Therefore, it is advantageous for the production of the amplifying type solid-state imaging apparatus. The reset operation described above makes it possible to clear the image information once and move to a storage operation for subsequent image information. Furthermore, when the reset operation is performed in the middle of the period during optical integration, image information prior thereto is cleared, and information after that point is stored. Thus, the so-called 'shuttering operation' can be performed.

Next, the operations during signal charge storage (signal readout and reset) will be quantitatively described with reference to FIGS. 2A, 2D and 2C. The conditions below are one example and herein, the semiconductor substrate 1 is formed of Si.

Substrate concentration: $Np \approx 1.0 \times 10^{15}/cm^3$ $N^-$ layer concentration: $Nn \approx 3.0 \times 10^{15}/cm^3$ $N^-$ layer thickness: $dn \approx 1.5$ μm Oxide film thickness: $do \approx 80$ nm.

wherein a signal charge density is represented by Nsig ($/cm^2$).

At this time, the distribution of the intrinsic potential φi is considered, and φi(b) of the substrate neutral region is set at 0.0 V. In the depth direction below the first gate electrode, an n-type layer surface potential is represented by $\phi i1(S)$, the bottom of the potential of the n-type layer (well layer 4) is represented by $\phi i1(M)$. The semiconductor surface potential below the second gate electrode 3 is represented by $\phi i2(S)$ and the flat band voltage is set at −0.85 V.
(During signal charge storage)

When VGA(L)=−3.0 V, and VGB(M)=1.0 V (i.e, 1.55 V on the basis of intrinsic potential), as shown with the values of FIGS. 2A, 2B and 2C,
in the case of Nsig=0,
$\phi i1(M)$=1.72 V,
$\phi i1(S)$=−0.93 V, $\phi i2(S)$=1.34 V,
In the case of Nsig=$5 \times 10^{11}$,
$\phi i1(M)$=2.89 V,
$\phi i1(S)$=0.83 V.

Namely, the values of $\Delta \phi B$ and $\Delta \phi AB$ shown in FIG. 2A, $\Delta \phi B$=1.34 V, and
in the case of Nsig=$5 \times 10^{11}$, $\Delta \phi AB$=0.51 V. Thus, signal charges are stored until the point that the signal charge density equals $5 \times 10^{11}$, and overflow exists beyond that point.
(During signal readout)

When VGA(H)=0.0 V, and VGB(H)=5.0 V,
in the case of Nsig=0,
$\phi i1(M)$=3.62 V,
$\phi i1(S)$=1.85 V,
$\phi i2(S)$=4.89 V,
In the case of Nsig=$5 \times 10^{11}$,
$\phi i1(M)$=4.99 V,
$\phi i1(S)$=3.63 V.

Herein, when a drain voltage VD is set at 5.0 V, $\phi iD$, on the basis of $\phi i1(M)$, is 5.60 V. Therefore, it is possible to sufficiently detect potentials in the range of Nsig≈0 to $10^{11}$. Furthermore, the difference between $\Delta \phi A(Det)$ and $\Delta \phi A(Sto)$ shown in FIGS. 2A and 2B is:

$\Delta \phi A(Det) - \Delta \phi A(Sto) = 0.73$ V.

Thus, a voltage margin between a non-readout pixel and a readout pixel can be sufficiently obtained. A detection signal voltage is detected as a variation of the signal charge amount of $\phi i1(M)$, which is represented by $\Delta \phi i1(M)$. In the case of Nsig=$5 \times 10^{11}$, $\Delta \phi i1(M)$ is 1.37 V.
(During reset operation)

When VGA(H)=0.0 V, and VGB(H)=1.0 V,
in the case of Nsig=0,
$\phi i1(M)$=3.62 V,
$\phi i1(S)$=1.85 V,
$\phi i2(S)$=1.34 V,
In the case of Nsig=$5 \times 10^{11}$,
$\phi i1(M)$=4.99 V,
$\phi i1(S)$=3.63 V.

In other, words, in the case of Nsig≈−$5 \times 10_{11}$ (a value smaller than and close to $5 \times 10^{11}$), $\phi i1(S)$ is larger than $\phi i2(S)$, and all signal charges are released from the semiconductor surface below the first gate electrode 2 through an area below the second gate electrode 3 and into the reset drain 8.

In this case, a maximum signal amount is $5 \times 10^{11}/cm^2$. For example, even in the case where a pixel size is as small as about 5 $\mu m$ by 5 $\mu m$ (25 $\mu m^2$) and an area of the first gate electrode 2 is about 10 $\mu m^2$, the signal amount per pixel is about $5 \times 10^4$ considering the number of holes, which is a sufficient value.

As quantitatively described above, according to the present invention, the reset operation does not require a high voltage while maintaining a sufficient signal amount. In Example 1, all of the operations can be performed with a power supply in the range of −3 V to +5 V. Furthermore, it is possible to complotoly release stored charges by the reset operation. When the conditions such as the concentration, thickness or the like of the n⁻ layer are changed, a driving voltage can easily be changed. Therefore, it is possible to change a variety of designs in accordance with these practical conditions.

EXAMPLE 2

Figure 3A:
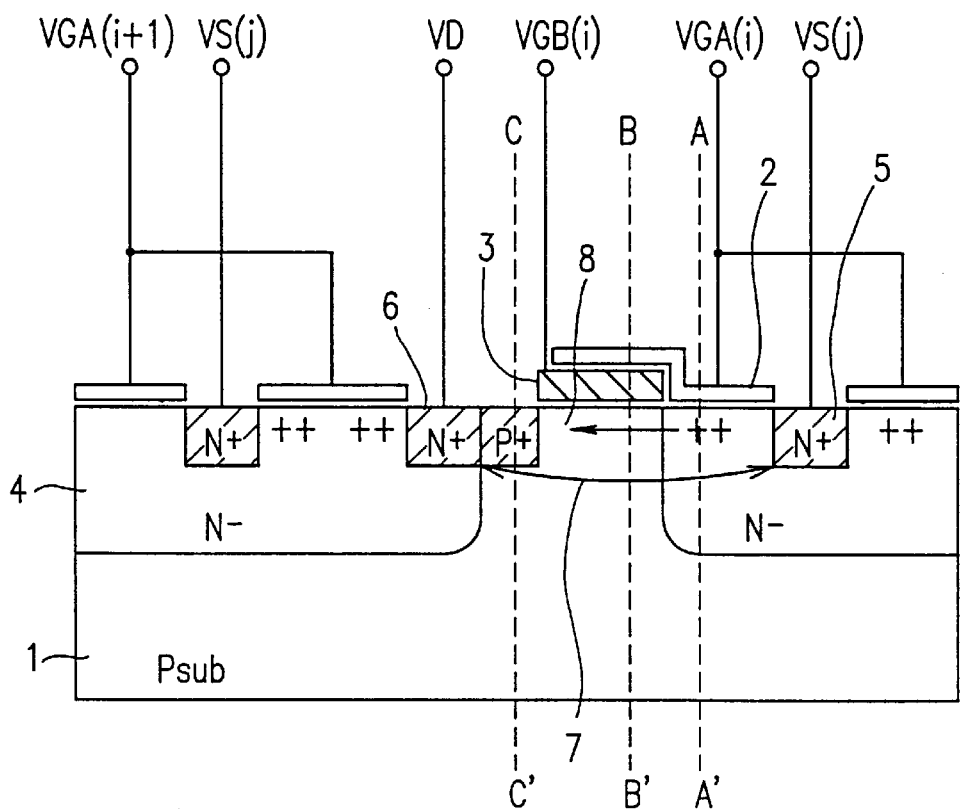
FIG. 3A is a cross sectional view of an amplifying type solid-state imaging device according to Example 2 of the present invention.
Figure 3B:
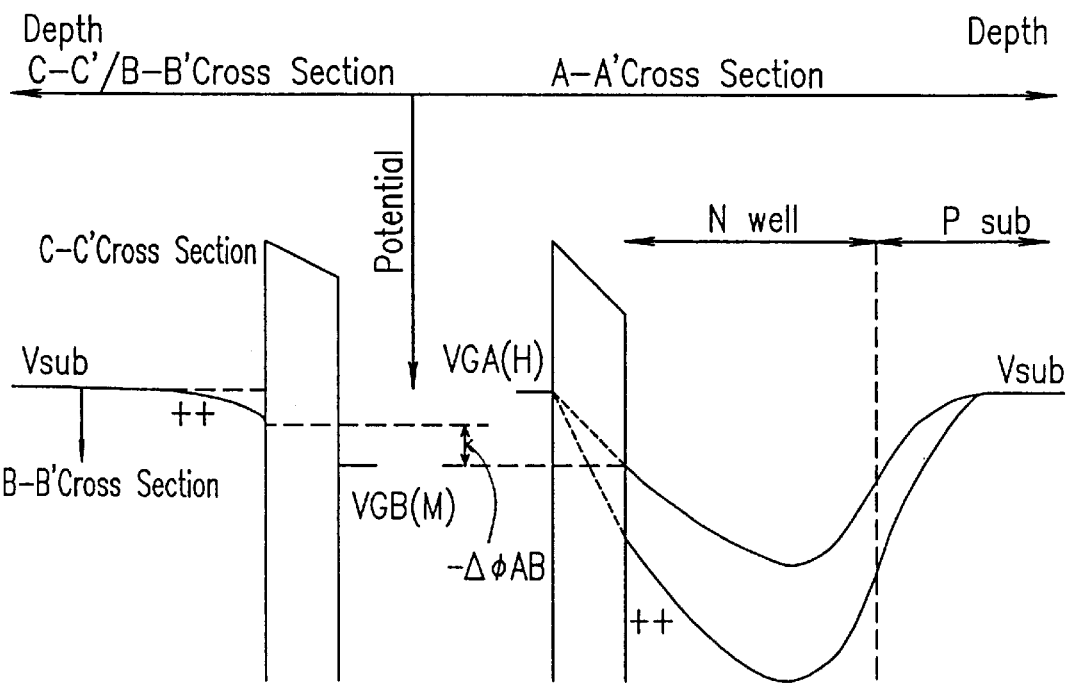
FIG. 3B shows a depth direction potential distribution for illustrating an operation during reset.

FIGS. 3A and 3B show the amplifying type solid-state imaging device of Example 2. The amplifying type solid-state imaging device of Example 2 has the same structure as that of Example 1, except for the position whereby the reset drain 8 is formed. More specifically, in Example 2, the reset drain 8 is formed in a position adjacent to the drain 6 in the well layer 4, The components corresponding to those in Example 1 bear the same reference numerals and the description thereof will be omitted.

Also in Example 2, the reset drain 8 is provided, such that stored signal charges can be reset in the same manner as in Example 1.

According to Example 2, when forming the reset drain 8, it can be formed by a self-alignment method of the second reset gate (i.e, the second gate electrode 3). Therefore, it is possible to produce the reset drain 8, the reset gate, and a well layer 4 with precise positional relationship, thus making it possible to prevent the non-uniformity in operation points at the time of a reset operation and the storage operation. As a result, the uniformity of characteristics can be improved.

EXAMPLE 3

Figure 4A:
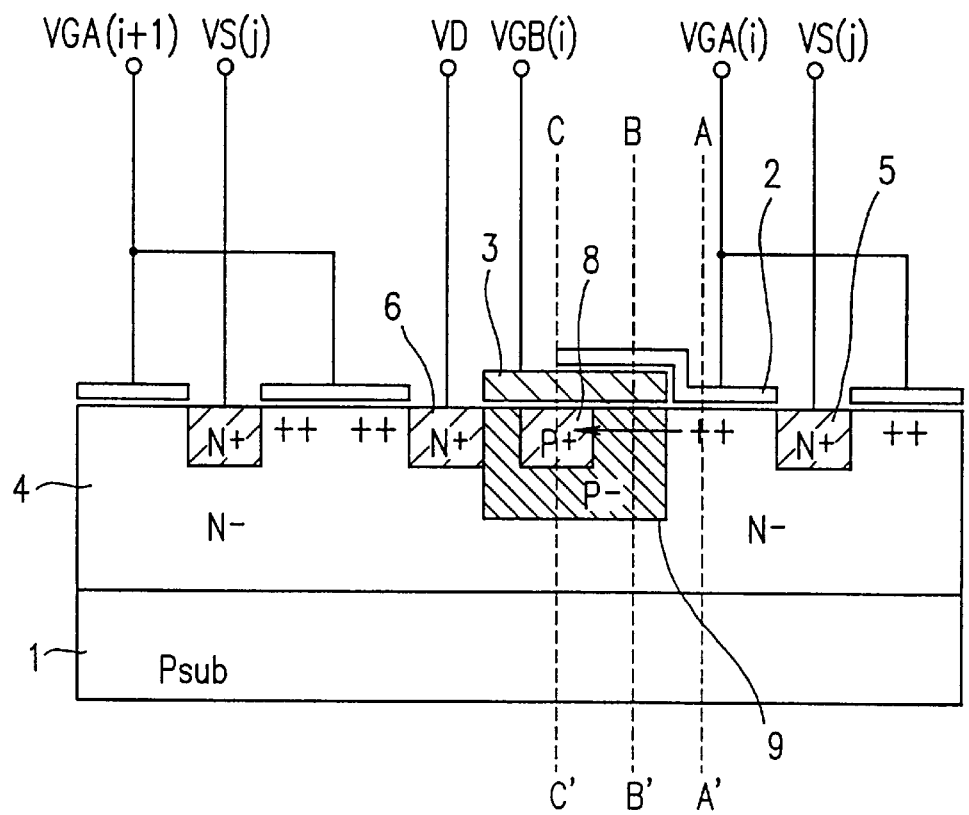
FIG. 4A is a cross sectional view of an amplifying type solid-state imaging device according to Example 3 of the present invention.
Figure 4B:
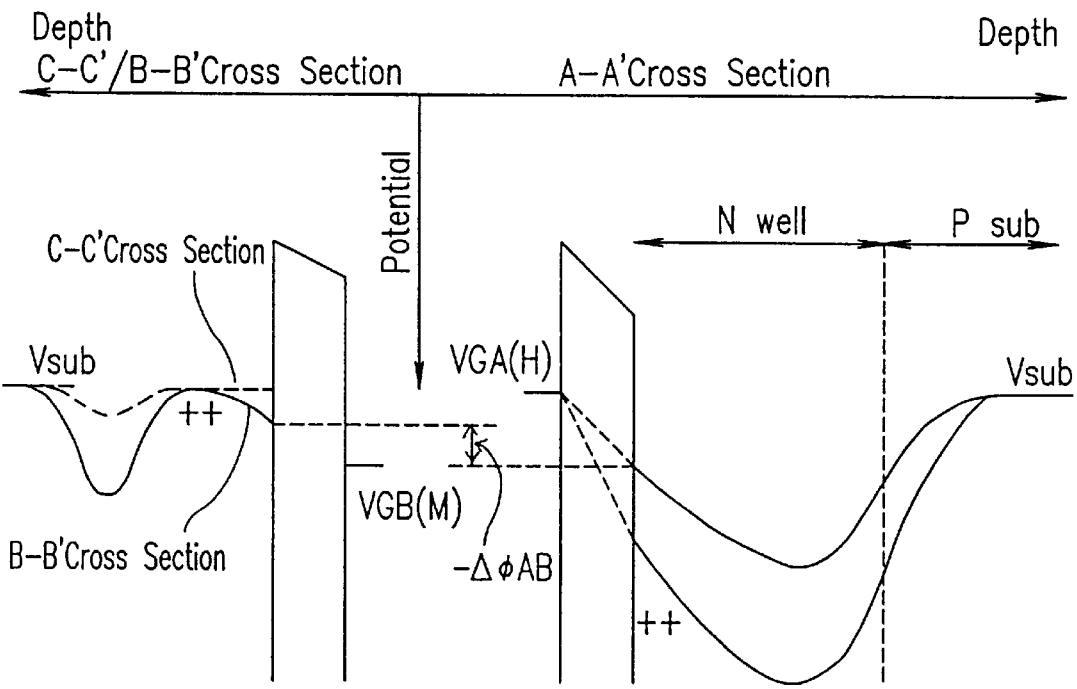
FIG. 4B shows a depth direction potential distribution for illustrating an operation during reset.

FIGS. 4A and 4B show the amplifying type solid-state imaging device of Example 3. As shown in FIG. 4A, an n-type semiconductor well layer 4 (well concentration: about $3.0 \times 10^{15}/cm^3$, thickness: about 1.5 $\mu m$) is formed on a p-type semiconductor substrate 1 (substrate concentration: about $1.0 \times 10^{15}/cm^3$). A first gate electrode 2 (n⁺ Poly Si: about 60 nm, oxide film thickness: about 80 nm), which functions as a first gate region, is formed on the semiconductor well layer 4. Furthermore, an n⁺ diffused layer is formed in the surface portion of the well layers 4. The n⁺ diffused layer constitutes a source 5 and a drain 6 of a MOS type transistor using the first gate electrode 2 as the gate thereof.

A second gate electrode 3 (n⁺ Poly Si: about 450 nm, oxide film thickness: about 80 nm), which functions as a second gate region, is formed above the semi-conductor substrate 1 on the side of the first gate electrode 2. One side of the second gate electrode 3 is adjacent to the first gate electrode 2. A p-type semiconductor well layer 9 (well concentration: about $1.0 \times 10^{15}/cm^3$, thickness: about 1.0 $\mu m$) is formed on the portion which functions as the second gate region on the surface of the substrate. After the semiconductor well layer 9 is formed, the second gate electrode 3 is formed thereon.

Furthermore, in the second gate region, the region across the length $\Delta L \approx 1.0$ $\mu m$ exists between the well layers 4 and the second gate electrode 3 so that a potential barrier is formed by the second gate electrode 3. In the region, a reset drain 8 formed of a p-type low resistant diffused region is formed. The reset drain 8 is formed before the second gate electrode 3 is formed. The n⁺ diffused layers for the source 5 and the drain 6 are formed after the second gate electrode 3 is formed.

In such a structure, incident light hυ having penetrated the first gate electrode 2 generates electron-hole pairs by photoelectric conversion in the photoelectric conversion region of the well layer 4, causing electrons to drift to the drain 6. On the other hand, holes are confined in the potential barrier, which is formed in an intermediate portion of the well layer 4, and the potential barrier below the second gate electrode 3. The holes are stored at the semiconductor/insulating film interface in the first gate region so as to become signal charges. The variation of the potential of the well layer 4, depending on the stored signal charge amount, is read out as an electric potential variation of the source 5 and used as an output signal. This operation is the same as in Example 1.

The potential barrier below the second gate electrode 3 functions as a potential barrier for storing signal charges at a semiconductor/insulating film interface in the first gate region. However, the potential barrier is lowered during the reset operation, and the signal charges are released to the reset drain 8 along the path shown by the arrow in FIG. 4A. As long as this function is provided, a variation in the potential distribution in the depth direction of the semiconductor layer may exist.

FIG. 4B shows a potential distribution during the reset operation. The right side of FIG. 4B shows a depth direction potential distribution below the first gate electrode 2. The left side of FIG. 4B shows the depth direction potential distribution of the region where the potential barrier is formed below the second gate electrode 3 and the depth direction potential distribution of a surface low resistant reset channel region below the Second gate electrode 3. As described above, the semiconductor well layer 9 (well concentration: about $5.0 \times 10^{15}/cm^3$, thickness ≈1.0 μm) functions as a potential barrier during the signal charge storage and readout operations. During a reset operation, a high voltage VGA(H) is applied to the first gate electrode 2, and a medium voltage VGB(M) is applied to the second gate electrode 3. At this point, if the surface potential below the second gate electrode 3 has a value ($-\Delta\phi AB$) sufficiently lower than the surface potential of the semiconductor well layer 4 when there is no signal charge, all signal charges, (i.e., holes on the surface of the semiconductor well layer 4) pass through the potential barrier gate below the second gate electrode 3 and flow into the reset drain 8. Thus, the reset operation is similar to Example 1.

According to Example 3, it is possible to form the p-type semiconductor well layer 9 in order to form a potential barrier below the second gate electrode 3 after the n⁻ type semiconductor well layer 4 below the first gate electrode 2 is formed. As a result, it is possible to form the n⁻ type semiconductor well layer 4 by an epitaxial growth method. Furthermore, since it is possible to form the n⁻ type semiconductor well layer 4 by an ion implantation method across the entire surface of the semiconductor substrate 1 without any limitation of a mask, a photoelectric conversion region below the first gate electrode 2 can be made large, namely, the n⁻ type semiconductor well layer 4 can be thick. In other words, in the case where the semiconductor well layer is formed partially by ion implantation, since it is necessary to use the resist as a mask, the semiconductor well layer cannot be formed deeper than necessary because of the excessively thick resist which can interfere with ion implantation. On the other hand, in the case where the entire surface can be subjected to ion implantation, the resist that have a constraint is not necessary. More specifically, in the case where the semiconductor well layer is formed using the sesist as the mask, the thickness of the semiconductor well layer is limited to about 1.5 μm, while the semiconductor well layer can have a thickness of, for example, about 2 μm to 3 μm in the case where the entire surface is subjected to ion implantation.

As described above, according to the present invention, since a photoelectric conversion region can be made large, the dynamic range can be correspondingly large, thereby resulting in improved characteristics for the amplifying type photoelectric converting device. Furthermore, a photo process of a resist is not required, thus simplifying the production process.

EXAMPLE 4

Figure 5:
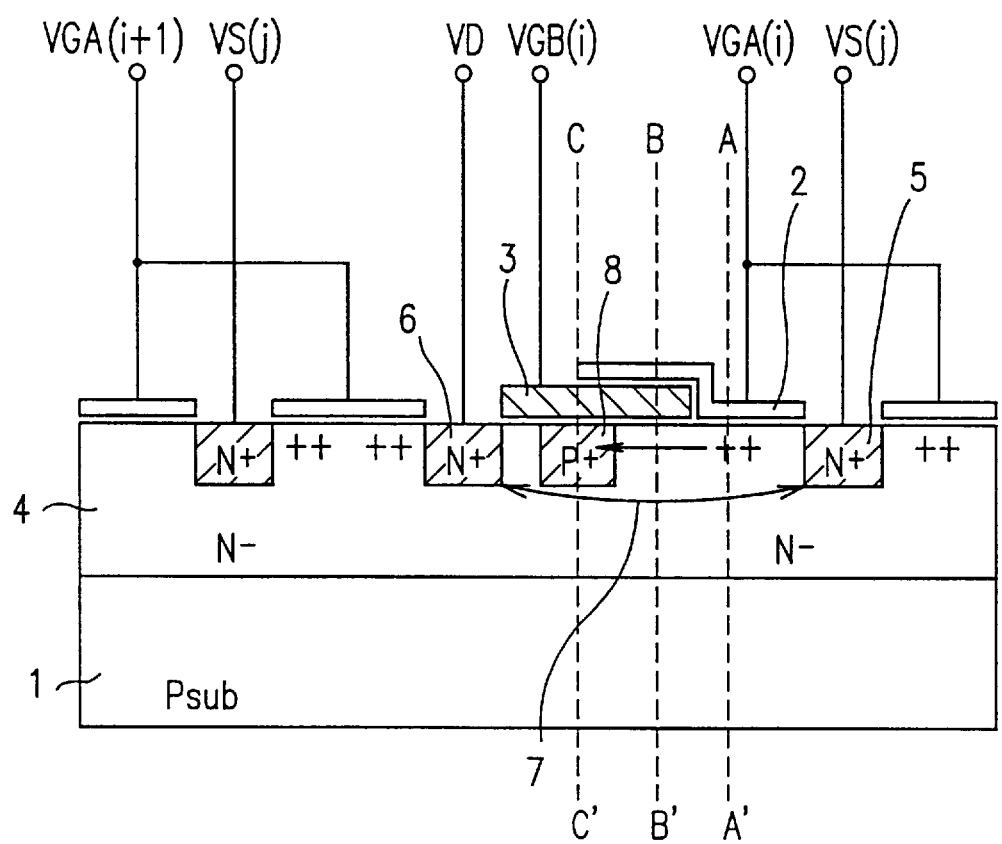
FIG. 5 is a cross sectional view of an amplifying type solid-state imaging device according to Example 4 of the present invention.

FIGS. 5 and 6A to 6C show the amplifying type solid-state imaging device of Example 4. As shown in FIG. 5, an n-type semiconductor well layer 4 (well concentration: about $3.0 \times 10^{15}/cm^3$, thickness: about 1.5 μm) is formed on a p-type semiconductor substrate 1 (substrate concentration: about $1.0 \times 10^{15}/cm^3$). A first gate electrode 2 (n⁺ Poly Si: about 60 nm, oxide film thickness, about 80 nm), which functions as a first gate region, is formed on the semiconductor well layer 4. Furthermore, an n⁺ diffused layer is formed in the surface portion of the well layers 4. The n⁺ diffused layer constitutes a source 5 and a drain 6 of a MOS type transistor using the first gate electrode 2 as the gate thereof.

A second gate electrode 3 (n⁺ Poly Si: about 450 nm, oxide film thickness: about 30 nm), which functions as a second gate region, is formed on the side of the first gate electrode 2. One side of the second gate electrode 3 is adjacent to the first gate electrode 2. In the second gate region, the region across the length $\Delta L \approx 1.0$ μm exists between the first gate region and the reset drain 8 formed of a p-type low resistant diffused region, so that a potential barrier is formed by the second gate electrode 3. The reset drain 8 is formed before the second gate electrode 3 is formed. The n⁺ diffused layers for the source 5 and the drain 6 are formed after the second gate electrode 3 is formed.

Also in Example 4, signal charges are stored in the same manner as in the previous examples. The amount by which the potential of the well layer 4 is varied depends on the stored signal charge amount which is read out as an electric potential variation of the source 5, and used as an output signal. The release of the signal charges is readily achieved by lowering the potential barrier below the second gate electrode 3 so that the signal charge drifts to the reset drain 8 along the path shown by the arrow in FIG. 5.

Next, the operations during signal charge storage, signal readout and reset will be described with reference to FIGS. 6A through 6C. The right side of FIGS. 6A through 6C show a depth direction potential distribution below the first gate electrode 2, and the left side of FIGS. 6A through 6C show a depth direction potential distribution below the second gate electrode 3.

First, the operation during signal charge storage will be described with reference to FIG. 6A.

A low voltage VGA(L) is applied to the first gate electrode 2, and a medium voltage VGB(M) is applied to the second gate electrode 3. The holes generated by photoelectric conversion are stored on the surface of the n-type semiconductor well layer 4 as signal charges, thereby raises the potential distribution from state (1) to state (2). During the period when a difference $\Delta\phi AB$ between the surface potential of the semiconductor well layer 4 and the surface potential below the second electrode 3 is large, the signal charges stay on the surface. However, when the potential distribution is beyond the limitation as shown in state (3), the signal charges jump the potential barrier below the second gate electrode 3 and flow to the reset drain 8. Thus, excess charge can overflow, thereby making it possible to prevent blooming. Herein, the potential depth of the n-type well layer 4 in the state (2) is represented by $\Delta\phi A(Sto)$.

Next, the operation during signal readout will be described with reference to FIG. 6B. A high voltage VGA (H) is applied to the first gate electrode 2. Thus, a potential distribution below the first gate electrode 2 is further raised so that when there is no signal charge, the potential distribution is in the state (4) and when signals are being stored, the potential distribution is in the state (5). The potential depth of the n-type well layer in the state (4) is represented by $\Delta\phi A(Det)$. The value of VGA(a) is selected so as to satisfy the inequality $\Delta\phi A(Det)>\Delta\phi A(Sto)$. This requirement is necessary to perform the readout of the signal only for a selected pixel.

On the other hand, a high voltage VGB(H') is applied to the second gate electrode 3. Thus, a potential barrier higher than the surface potential of the n-type semiconductor well layer 4 by $\Delta\phi AB$ during the signal storage operation (in the state (5)) is formed below the second gate electrode 3. This prevents the signal charges from flowing from the surface of the n-type semiconductor well layer 4 to the reset drain 8.

Next, the operation during reset will be described with reference to FIG. 6C. A high voltage such as VGA(H) during the signal readout is applied to the first gate electrode 2, and a medium voltage such as VGB(M) during the signal storage is applied to the second gate electrode 3, At this point, the potential below the second gate electrode 3 is a value ($-\Delta\phi AB$) which is sufficiently lower than the surface potential of the well layer 4 when there is no signal charge (i.e, in the state (4)'). As a result, all signal charges on the surface of the n-type semiconductor well layer 4 pass below the second gate electrode 3 and are released to the reset drain 8. In other words, a reset operation is achieved. Once the image information is cleared, it is possible to move onto a storage operation for subsequent image information. Furthermore, when the reset operation is performed in the middle of the period during optical integration, the image information prior thereto is cleared, and the information after that point is stored. Thus, the so-called 'shuttering operation' can be performed.

In Example 4, as shown in FIGS. 6A, 6B and 6C, the potential profile below the second electrode 3 is identical to the potential profile below the first electrode for storing the signal charges generated by photoelectric conversion. Moreover, a potential difference is generated depending on a voltage applied to each gate. In this manner, a potential barrier is formed so as to operate in storage mode, readout mode and reset mode.

Furthermore, according to the device structure of Example 4, the n-type semiconductor well layer 4 can be formed by an epitaxial growth method. Moreover, the semiconductor well layer 4 can be formed on the entire face of the semiconductor substrate 1 by ion implantation without the limitation of a mask. As a result, as in Example 3, since a photoelectric conversion region below the first gate electrode 2 can be made large, the dynamic range can be correspondingly large, thus resulting in improved characteristics of the amplifying type photo-electric converting device. Furthermore, a photo process of a resist is not required, thus simplifying the production process.

EXAMPLE 5

Figure 7A:
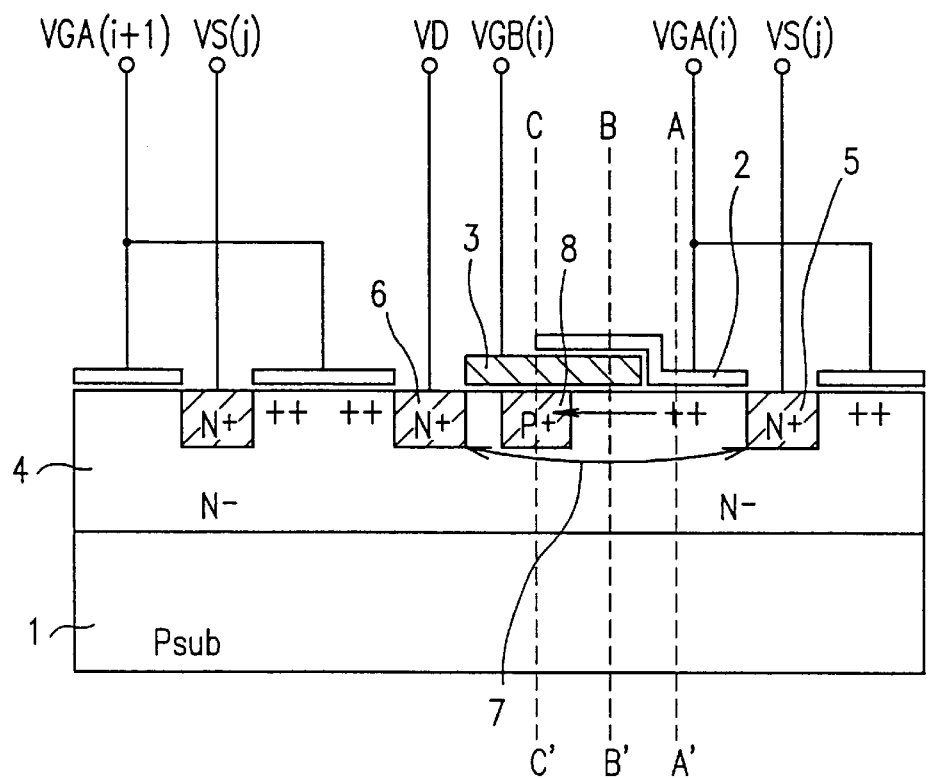
FIG. 7A is a cross sectional view of an amplifying type solid-state imaging device according to Example 5 of the present invention.
Figure 7B:
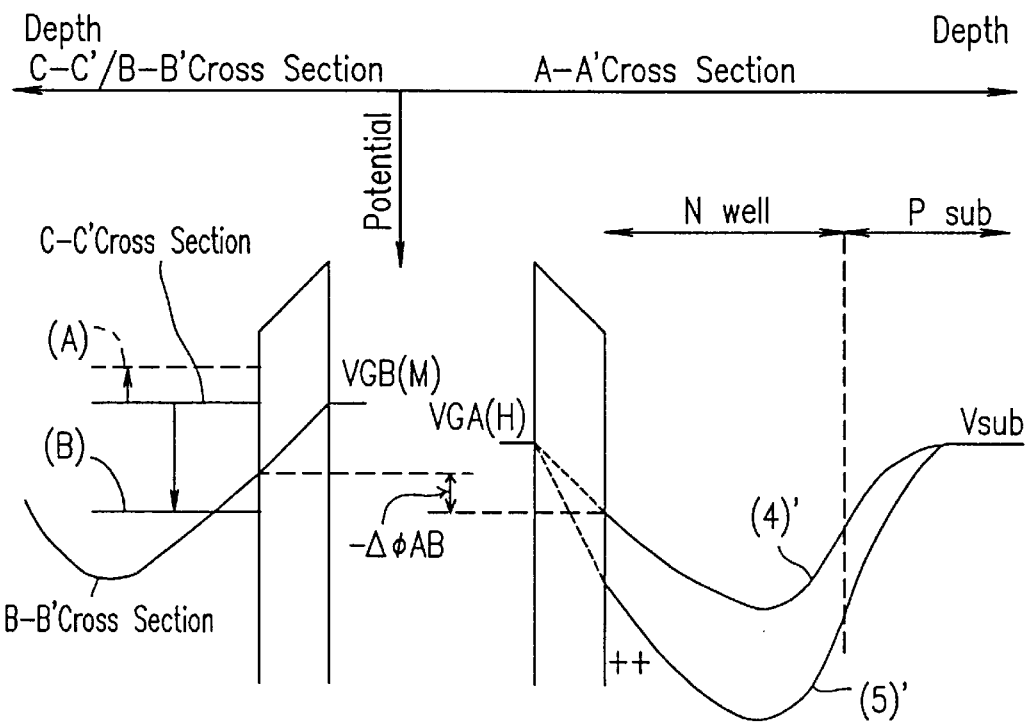
FIG. 7B shows a depth direction potential distribution for illustrating an operation during reset.

FIGS. 7A and 7B show the amplifying type solid-state imaging device of Example 5. The device structure of Example 5is the same as that of Example 4. Therefore, The components shown in FIG. 7A are identical to those shown in FIG. 5, and the corresponding components bear the same reference numerals. However, in Example 5, the electric potential of the reset drain 8 is varied independently of that of the semiconductor substrate 1. With this structure, an electric field intensity between the first gate region which functions as a charge storage region, and the reset drain 8, is arbitrarily set. As a result, a running rate of holes to the reset drain 8 is raised so as to realize a high speed reset operation.

The operation during reset will be described with reference to FIG. 7B. The right side of FIG. 7B shows a depth direction potential distribution below the first gate electrode 2. The left side of FIG. 7B shows the depth direction potential distribution of the region where the potential barrier is formed below the second gate electrode 3 and the depth direction potential distribution of the reset region 8 below the second gate electrode 3.

In the reset operation, as in Example 4, a high voltage VGA(H) is applied to the first gate electrode 2, and a medium voltage VGB(M) is applied to the second gate electrode 3. At this point, the potential below the second gate electrode 3 is a value ($-\Delta\phi AB$) sufficiently lower than the surface potential of the n-type semiconductor well layer 4 when there is no signal charge (i.e, in the state (4)'). As a result, all signal charges (i.e., holes) on the surface of the n-type semiconductor well layer 4 pass through the potential barrier gate below the second gate electrode 3 and are released to the p-type reset drain 8. Namely, a reset operation is achieved.

In Example 5, it is possible to independently vary the electric potential of the reset drain 8 by the level indicated by (A) in FIG. 7B. This variation is achieved, for example, by connecting a control terminal $V_{HD}$ for the voltage adjustment (see FIGS. 14A and 14B) of the reset drain 8.

With such a structure, a high speed reset operation can be realized. Therefore, when applied to a solid-state imaging apparatus, a signal output rate per frame can be improved, thus leading to the realization of a high performance amplifying type solid-state imaging apparatus.

Furthermore, in Example 5, in the signal charge storage operation, a voltage VGA(L') slightly higher than the voltage VGA(L) for signal charge storage is applied to the first gate electrode 2. The n-type layer surface potential, when there is no signal charge, is lower by $\Delta\phi IN$ then the surface reset drain potential VRD(M) which is applied later. On the other hand, a voltage VGB(L), which is lower then the voltage VGA(L') applied to the first gate electrode 2, is applied to the second gate electrode 3, so that the reset gate barrier $\Delta\phi AB$ disappears. At this point, the VRD(M) is applied to the reset drain 8. As a result, holes flow from the reset drain 8 to the surface of the n-type layer until the n-type layer surface potential is matched with the potential of the reset drain 8. In other words, an offset charge Qo is injected. After letting this state darken, the state moves into a signal charge storage state. More specifically, the voltage of the second gate electrode 3 is set at a medium voltage such as VGB(M'), so as to form a barrier $\Delta\phi B'$ below the second gate electrode 3. The signal charge Q of holes generated by photoelectric conversion is added to the signal charge Qo, and the state where the signal charges Qo+Q are stored appears. If this state is a bright state, during the period when the difference $\Delta\phi AB'$ between the n-type layer surface potential and the surface potential below the second electrode 3 is large, the signal charges stay on the surface.

However, when the potential distribution is beyond this limitation, the signal charges jump the potential barrier below the second gate electrode 3 and flow to the reset drain 8. Consequently, excess charge can overflow, thus making it possible to prevent blooming.

The readout operation is the same as the signal readout operation in the previous examples. However, in Example 5, since the signal charge amount is changed from Qo to Qo+Q, it is necessary to read out the signal as a difference thereof. In the offset charge injection mode described herein, the signal charges on the n-type surface are never depleted because the n-type surface is constantly covered with the signal charges, thus preventing a dark current. The variation of the n-type layer channel potential with respect to the signal charges is one-dimensionally in proportion, but in practice, it is not necessarily in proportion due to a two-dimensional effect. This is the main factor for determining the likelihood of non-uniformity in pixels and fixed pattern noises (FPN). However, this two-dimensional effect is significant in the case of a small signal amount, and when the signal amount is increased, the influence thereof can be eliminated. Therefore, according to Example 5, where offset charges are injected, the two-dimensional effect can be prevented, thus leading to significant reduction of the FPN.

EXAMPLE 6

FIGS. 8 and 9A to 9C show the amplifying type solid-state imaging device according to Example 6 of the present invention. In Example 6, as described later, the potential distribution of the first gate region is intentionally different from that of the second gate region.

An n-type semiconductor well layer 4 (well concentration: about $3.0 \times 10^{15}/cm^3$, thickness: about 1.5 $\mu$m) is formed on a p-type semiconductor substrate 1 (substrate concentration: about $1.0 \times 10^{15}/cm^3$). A first gate electrode 2 (n$^+$ Poly Si: about 60 nm, oxide film thickness: about 80 nm), which functions as a first gate region, is formed on the semiconductor well layer 4. Furthermore, an n$^+$ Poly diffused layer is formed on the surface portion of the semiconductor well layers 4. The n$^+$ diffused layer constitutes a source 5 and a drain 6 of a MOS type transistor using the first gate electrode 2 as the gate.

An n-type semiconductor well layer 10 (well concentration: about $5.0 \times 10^{14}/cm^3$, thickness: about 0.8 $\mu$m) is formed on the surface portion of the semiconductor substrate 1 on the side of the first gate electrode 2. A second gate electrode 3 (n$^+$ Poly Si: about 450 nm, oxide film thickness: about 30 nm), which functions as a second gate region is formed thereon. One side of the second gate electrode 3 is adjacent to the first gate electrode 2.

Furthermore, in the second gate region, the region across the length $\Delta L \approx 1.0$ $\mu$m exists between the first gate region and the reset drain 8 which is formed of a p-type low resistant diffused region formed in the surface portion of the n-type semiconductor well layer 10, so that a potential barrier is formed by the second gate electrode 3. The reset drain 8 is formed before the second gate electrode 3 is formed. The n$^+$ diffused layers for the source 5 and the drain 6 are formed after the second gate electrode 3 is formed.

Also in Example 6, signal charges are stored in the same manner as in the previous examples. The amount by which the potential of the semiconductor well layer 4 is varied, depending on the stored signal charge amount, is read out as an electric potential variation of the source 5, and used as an output signal.

Figure 8:
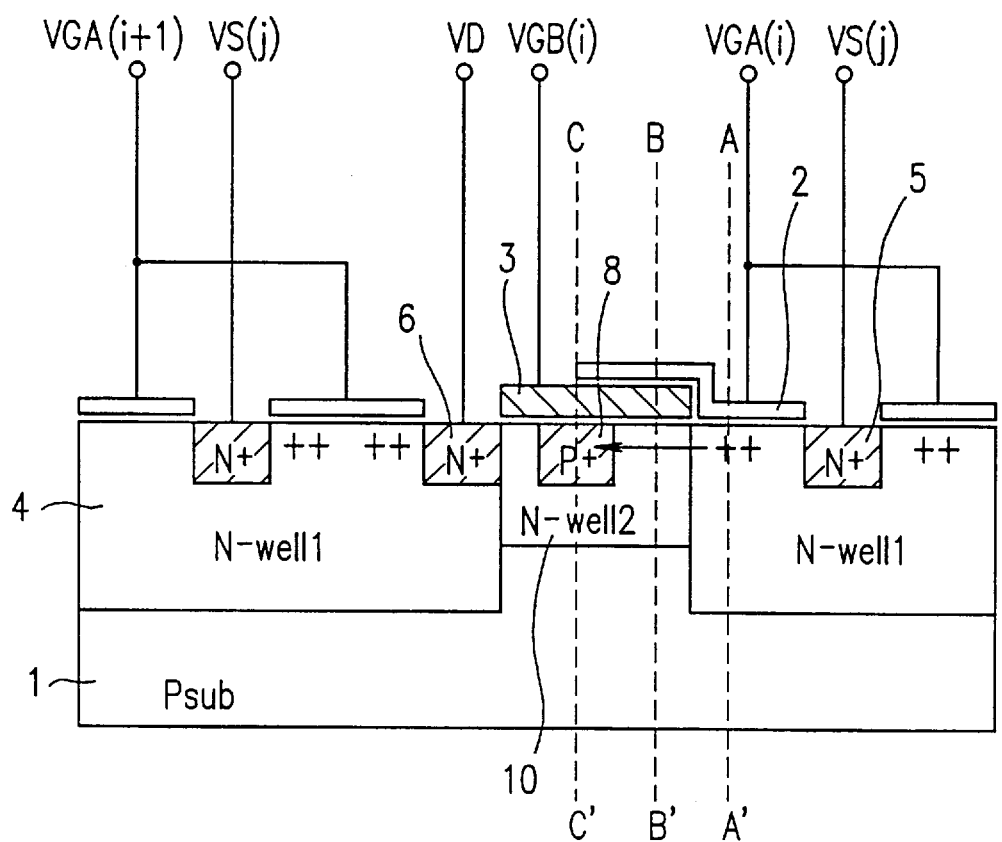
FIG. 8 is a cross sectional view of an amplifying type solid-state imaging device according to Example 6 of the present invention.

Similarly, the release of the signal charges is readily achieved by lowering the potential barrier below the second gate electrode 3 so that the signal charge drifts to the reset drain 8 along the path shown by the arrow in FIG. 8.

The reset operation will be described with reference to FIGS. 9A through 9C. The right side of FIGS. 9A through 9C show a depth direction potential distribution below the first gate electrode 2 and a depth direction potential distribution below the second gate electrode 3. The left side of FIG. 9A through 9C show a depth direction potential distribution of the reset drain 8 below the second gate electrode 3.

First, the operation during signal charge storage will be described with reference to FIG. 9A.

A low voltage VGA(L) is applied to the first gate electrode 2, and a medium voltage VGB(M) is applied to the second gate electrode 3. The holes generated by photoelectric conversion are stored on the surface of the n-type semiconductor well layer 4 as signal charges, thereby raising the potential distribution from state (1) to state (2). In example 6 as well as the previous examples, during the period when the difference $\Delta \phi AB$ between the surface potential of the n-type semiconductor well layer 4 and the surface potential below the second electrode 3 is large, the signal charges stay on the surface. However, when the potential distribution is beyond the limitation, the signal charges jump the potential barrier below the second gate electrode 3 and flow to the reset drain 8. Thus, excess charge can overflow, thus making it possible to prevent blooming. Herein, the potential depth of the n-type well layer in the state (1) is represented by $\Delta \phi A(Sto)$.

Next, the operation during signal readout will be described with reference to FIG. 9B.

A high voltage VGA (H) is applied to the first gate electrode 2. Thus, a potential distribution below the first gate electrode 2 is further raised so that when there is no signal charge, the potential distribution is in the state (4) and when signals are being stored, the potential distribution is in the state (5). The potential depth of the n-type well layer in the state (4) is represented by $\Delta \phi A(Det)$. The value of VGA(H) is selected so as to satisfy the inequality $\Delta \phi A(Det) > \Delta \phi A (Sto)$. This reason is described above.

On the other hand, a high voltage VGB(H) is applied to the second gate electrode 3. Thus, a potential barrier higher than the surface potential of the n-type semiconductor well layer 4 by $\Delta \phi AB$, during the signal storage operation (in the state (5)), is formed below the second gate electrode 3, so as to prevent the signal charges from flowing from the surface of the n-type semiconductor well layer 4 to the reset drain 8.

Next, the reset operation will be described with reference to FIG. 9C.

A high voltage such as VGA(H) during the signal readout is applied to the first gate electrode 2, and a medium voltage, such as VGB(M) during the signal storage, is applied to the second gate electrode 3. At this point, the potential below the second gate electrode 3 is a value ($-\Delta \phi AB$) sufficiently lower than the surface potential of the n-type well layer 4 when there is no signal charge (i.e, in the state (4)'). As a result, all signal charges (holes) on the surface of the n-type semiconductor well layer 4 pass below the second gate electrode 3 and are released to the reset drain 8. Thus, a reset operation is achieved. Also in Example 6, when the reset operation is performed in the middle of the period during optical integration, the prior image information is cleared, and the information after that point is stored. Thus, the so-called 'shuttering operation' can be performed.

As understood from FIGS. 9A, 9B and 9C, in Example 6, the potential distribution in the first gate region is intentionally different from that in the second gate region. As a result, it is possible to obtain a large photoelectric conversion region so as to obtain a desired wavelength sensitivity characteristic in the first gate region to function as the photoelectric conversion region. Furthermore, in the second gate region which defines the dynamic range, it is possible to set a capacitance for storing photoelectric conversion carriers as desired. Moreover, it is possible to set the potential barrier of the second gate region so that the device can operate even in a predetermined driving voltage region.

EXAMPLE 7

FIGS. 10 and 11A to 11C show the amplifying type solid-state imaging device according to Example 7 of the present invention. In Example 7, electrons function as signal charges.

An n-type semiconductor well layer 4 (well concentration: about $3.0 \times 10^{15}/cm^3$, thickness: about 0.8 $\mu$m) is formed on a p-type semiconductor substrate 1 (substrate concentration: about $1.0 \times 10^{15}/cm^3$). A first gate electrode 2 (n$^+$ Poly Si: about 60 nm, oxide film thickness: about 80 nm), which functions as a first gate region, is formed on the semiconductor well layer 4. Furthermore, the p$^+$ diffused layer is formed in the surface portion of the well layers 4. The p$^+$ diffused layer constitutes a source 5 and a drain 6 of a MOS type transistor using the first gate electrode 2 as the gate thereof.

A second gate electrode 3 (n$^+$ Poly Si: about 450 nm, oxide film thickness: about 80 nm) to function as a second gate region is formed on the semiconductor substrate 1 on the side of the first gate electrode 2, adjacent to the first gate region. Furthermore, a region across a length $\Delta L \approx 1.0$ $\mu$m is ensured to exist in the second gate region so that a potential barrier is formed by the second gate electrode 3. In that region, a reset drain 8 formed of an n-type low resistant diffused region is formed. The reset drain 8 is formed before the second gate electrode 3 is formed. The p$^+$ diffused layers for the source 5 and the drain 6 are formed after the second gate electrode 3 is formed.

In such a structure, incident light hυ having penetrated the first gate electrode 2 generates electron-hole pairs by photoelectric conversion in the photoelectric conversion region of the semiconductor well layer 4, and holes drift to the drain 6. On the other hand, electrons are confined in a potential barrier formed on the surface of the well layer 4 and a potential barrier below the second gate electrode 3. The electrons are stored in a buried channel section in the first gate region so as to become signal charges. The amount by which the potential of the n-type semiconductor well layer 4 is varied depending on the stored signal charge amount is read out as an electric potential variation of the source 5, and used as an output signal.

Figure 10:
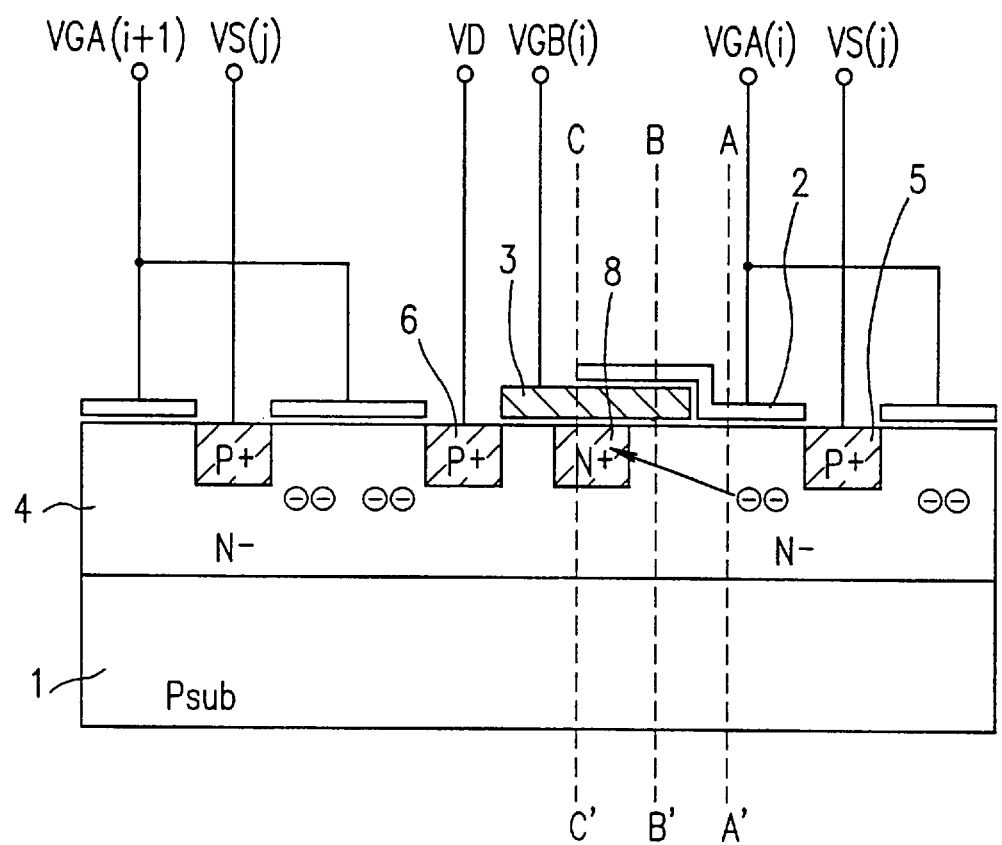
FIG. 10 is a cross sectional view of an amplifying type solid-state imaging device according to Example 7 of the present invention.

The release of the signal charge is readily achieved by lowering the potential barrier below the second gate electrode 3 so that the signal charge drifts to the reset drain 8 along the path shown by the arrow in FIG. 10.

Next, the operations during signal charge storage, signal readout and reset will be more specifically described with reference to FIGS. 11A through 11C. The right side of FIGS. 11A through 11C show a depth direction potential distribution below the first gate electrode 2. The left side of FIG. 11A through 11C show a depth direction potential distribution below the second gate electrode 3.

First, the operation during signal charge storage will be described with reference to FIG. 11A.

A high voltage VGA(H) is applied to the first gate electrode 2, and a medium voltage VGB(M) is applied to the second gate electrode 3. The electrons generated by photoelectric conversion are stored in the n-type semiconductor well layer 4 as signal charges. This lowers the potential distribution from state (1) to state (2). During the period when the difference $\Delta\phi AB$ between the bottom potential of the n-type semiconductor well layer 4 and the bottom potential below the second electrode 3 is large, the signal charges stay in the well layer 4. However, when the difference $\Delta\phi AB$ is beyond the limitation, the signal charges jump the potential barrier below the second gate electrode 3 and flow to the reset drain 8. Thus, excess charge can overflow, thus making it possible to prevent blooming. Herein, the surface potential of the reset drain 8 in the state (2) is represented by $\Delta\phi A(Sto)$.

Next, the operation during signal readout will be described with reference to FIG. 11B.

A low voltage VGA(L) is applied to the first gate electrode 2. Thus, a potential distribution below the first gate electrode 2 is further lowered so that when there is no signal charge, the potential distribution is in the state (4) and when signals are being stored, the potential distribution is in the state (5). The surface potential in the state (4) is represented by $\Delta\phi A(Det)$. The values of VGA(H) and VGA(L) are selected so as to satisfy an inequality $\Delta\phi A(Det) < \Delta\phi A(Sto)$. This is to make it possible to read a signal only for a selected pixel.

On the other hand, a low voltage VGB(L) is applied to the second gate electrode 3. Thus, a potential barrier higher than the bottom potential of the well layer 4 by $\Delta\phi AB$ during the signal storage operation (in the state (5)) is formed below the second gate electrode 3, thereby preventing the signal charges from flowing from the surface of the well layer 4 to the reset drain 8.

Next, the reset operation will be described with reference to FIG. 11C.

A low voltage such as VGA(L) during the readout operation is applied to the first gate electrode 2, whereas a high voltage VGB(H) is applied to the second gate electrode 3. At this point, the bottom potential below the second gate electrode 3 is a value ($-\Delta\phi AB$) sufficiently lower than the bottom potential of the n-type well layer 4 when there is no signal charge (i.e, in the state (4)'). As a result, all signal charges in the n-type semiconductor well layer 4 pass below the second gate electrode 3 and are released to the reset drain 8. At this time, a positive voltage of VRD is applied to the reset drain 8. Thus, a reset operation is achieved by drawing electrons.

Therefore, also in Example 7, by performing the reset operation, image information is cleared once, thereby moving into the storage operation of subsequent image information. Furthermore, when the reset operation is performed in the middle of the period during optical integration, the image information prior thereto is cleared, and the information after that point is stored. Thus, the so-called 'shuttering operation' can be performed.

In Example 7, as described above, electrons are used as signal charges, while adopting a device structure, thus resulting in the following effects. In the case where holes are used as signal charges the holes are stored only on the surface of the well layer 4. On the other hand, in the case of electrons, the electrons are also stored deep in the well layer, and the electrons can be released to the reset drain 8 after readout. Therefore, a photoelectric conversion region can be made large. As a result, the dynamic range can be correspondingly large, thus leading to the improved characteristics of the amplifying type photoelectric converting device.

Furthermore, as in Example 4, with such a device structure, the n-type semiconductor well layer 4 can be formed by an epitaxial growth method. Moreover, the semiconductor well layer 4 can be formed on the entire face of the semiconductor substrate 1 by an ion implantation method without any mask limitations. As a result, a photo process of a resist is not required, thus simplifying the production process.

EXAMPLE 8

FIGS. 12A to 12C and 13A to 13C show the amplifying type solid-state imaging device of Example 8. In Example 8, as apparent from FIGS. 12B and 12C and as described below, an n-type layer 4 is formed on the p-type semiconductor substrate 1 so as to cover the entire pixel region.

Figure 12A:
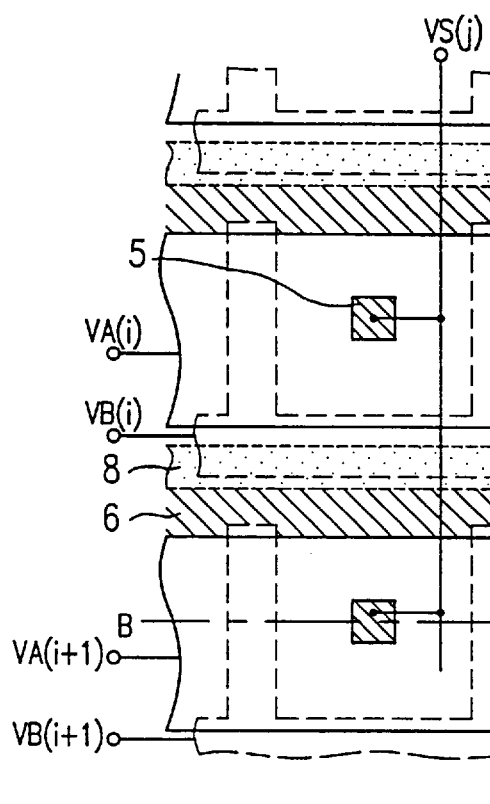
FIG. 12A is a plan view of an amplifying type solid-state imaging device according to Example 8 of the present invention.

As shown in FIG. 12A, the first gate electrode 2 is connected to clock lines indicated by VA(i), VA(i+1) or the like commonly in the horizontal direction. The second gate electrode 3 is formed below the first gate electrode 2, and serves to separate pixels in the horizontal direction. A drain 6 is formed so as to separate pixels with respect to holes in the vertical direction, as shown by the hatching between horizontal pixel rows (2×2=4 pixels are displayed in FIG. 12A), and supplied with a drain voltage VDD from a peripheral section. The dotted region is a reset drain 8 formed of a p+ layer. The reset drain 8 is supplied with a reset, channel voltage VLL from the peripheral section. A source 5 is formed for each pixel in the middle of the longitudinal direction of the first gate electrode 2, and connected to signal lines indicated by VS(j), VS(j+1) or the like commonly in the vertical direction. A variation of the n-type layer potential below the first gate electrode for each pixel is detected as a variation of the source electric potential in the signal lines VS(j), VS(j+1) or the like.

Figure 13A:
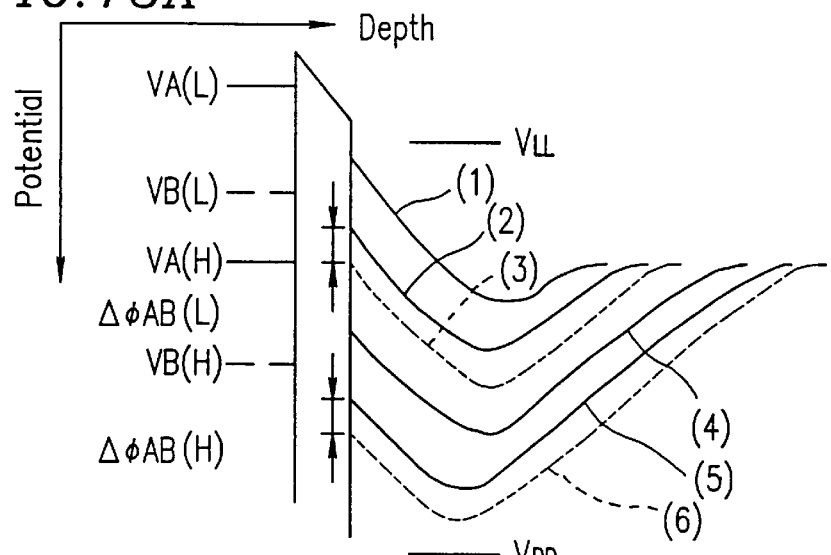
FIG. 13A shows a potential distribution of an amplifying type solid-state imaging device according to Example 8.
Figure 13B:
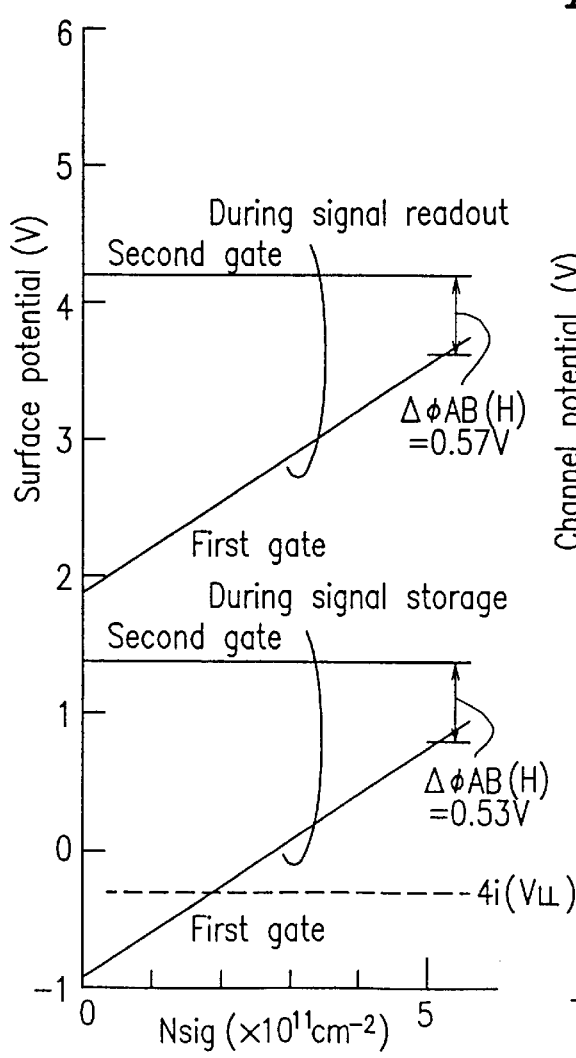
FIG. 13B shows the relationship between a surface potential (V) and signal charges of the amplifying type solid-state imaging device according to Example 8.

This operation will be described with reference to FIGS. 13A to 13C. FIG. 13A shows potential distributions below the first gate electrode 2 and below the second gate electrode 3 during signal charge storage and signal readout. During signal charge storage, a voltage VA(L) is applied to the first gate electrode 2, and a voltage VB(L) is applied to the second gate electrode 3. The levels of the drain voltage VDD and the reset drain voltage VLL are shown in FIG. 13A. In the case of no signal charge (holes), the potential below the first gate electrode 2 is in state (1). In the case of the maximum signal charge, the potential below the first gate electrode 2 is in state (2). Furthermore, the potential below the second gate electrode 3 is in state (3).

As apparent from the description above, for the surface potential below the first gate electrode 2, the surface potential below the second gate electrode 3 works like a barrier with respect to the reset channel level. Therefore, signal charges are not released until the signal charges are at the maximum. When the signal charges exceed the maximum, the charges start to flow by jumping the barrier $\Delta\phi AB(L)$ (set at ~0.5 V), and thus excess charges overflow.

During signal readout, a voltage VA(H) is applied to the first gate electrode 2, and a voltage VB(H) is applied to the second gate electrode 3. In the case of no signal charge (holes), the potential below the first gate electrode 2 is in state (4). In the case of the maximum signal charge, the potential below the first gate electrode 2 is in state (5). Furthermore, the potential below the second gate electrode 3 is in state (6). As apparent from the description above, for the surface potential below the first gate electrode 2, the surface potential below the second gate electrode 3 works as a barrier of $\Delta\phi AB(H)$ or higher. (set at >0.5 V) with respect to the reset channel level. Therefore, signal charges are not released.

As apparent from the comparison between the state (2) and the state (5), the channel potential of the well layer 4 in the first gate region is sufficiently large during signal readout, compared with during signal storage, so that when a constant current is applied to the signal lines, the channel potential value of the well layer 4 during signal readout can be obtained on the signal lines.

In the reset operation, a voltage applied to the second gate electrode 3 is changed to VB(L). As a result, since, for the surface potential of the first gate region, the barrier disappears with respect to the reset channel level, all signal charges are released to the reset drain 8.

In the above-mentioned operations, the function of a region which separates pixels in the horizontal direction defined by the second gate electrode 3 is explained in the same manner. More specifically, in the operations during signal storage and signal readout, the surface potential below the second gate electrode 3 works as a barrier with respect to the surface potential below the first gate electrode 2. Therefore, signals are prevented from moving between pixels in the horizontal direction. In the reset operation, the barrier disappears, but signal charges disappear to the reset drain 8. As a result, there is no need for pixel separation. Therefore, according to Example 8, the pixel separation can be performed, thus leading to improved accuracy in readout.

The above-mentioned operations will be described with reference to FIGS. 13B and 13C below. The concentrations and the sizes of components are as follows.

P-type substrate concentration: $Np \approx 1.0 \times 10^{15}/cm^3$ $N^-$ layer concentration: $Nn \approx 3.0 \times 10^{15}/cm^3$ $N^-$ layer thickness: $dn \approx 1.5$ μm Gate insulating film thickness: $do \approx 80$ nm Drain voltage: VDD=5.0 V Reset drain voltage: VLL=0.0 V In the case where the conditions are set as above, the distribution of intrinsic potential $\phi i$ is considered, and a potential $\phi i(b)$ in a neutral region of the p-type semiconductor substrate 1 is set at 0.0 V. Moreover, the n-type layer surface potential below the first gate electrode 2 is represented by $\phi i1(s)$ and the n-type layer channel potential below the first gate electrode 2 by $\phi i1(m)$. The n-type layer surface potential below the second gate electrode 3 is represented by $\phi i2(s)$ and the n-type layer channel potential below the second gate electrode 3 by $\phi i 2(m)$. A flat band voltage VFB is set at −0.85 V. The potentials $\phi i1$ and $\phi i2$ for each operation will be calculated below. At this point, since the Fermi level of the p-type semiconductor substrate 1 is shifted by 0.29 V from the intrinsic level, a substrate voltage VSUB is 0.29 V. Furthermore, the intrinsic levels of the drain and the reset drain are 5.85 V and −0.27 V, respectively.

(Signal storage operation)

When VA(L)−VSUB=−3.0 V, and

VB(L)−VSUB=−0.5 V, in the case of Nsig=0, $\phi i1(s)=-0.93$ V, $\phi i1(m)=+1.72$ V, In the case of $Nsig=5 \times 10^{11}$, $\phi i1(s)=+0.83$ V, $\phi i1(m)=+2.89$ V.

Furthermore, $\phi i2(s)=1.36$ V, $\phi i2(m)=3.30$ V.

Figure 12B:
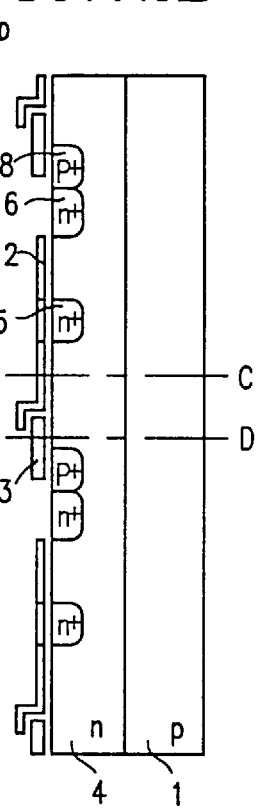
FIG. 12B is a cross sectional view taken at line A—A of the amplifying type solid-state imaging device shown in FIG. 12A.
Figure 12C:
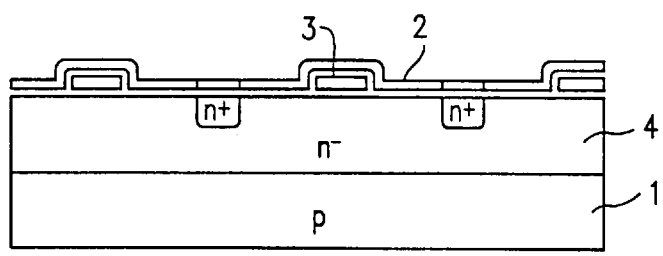
FIG. 12C is a cross sectional view taken at line B—B of the amplifying type solid-state imaging device shown in FIG. 12A.

Therefore, a barrier $\Delta\phi AB(L)=\phi i2(s)-\phi i1(s)$ (in the case of $Nsig=5 \times 10^{11}$)=1.36 V−0.83 V=0.53 V (see FIG. 12B). When Nsig is $\sim 5 \times 10^{11}$ or more (value close to and more than $5 \times 10^{11}$), signal charges overflow.

(Signal readout operation)

When VA(H)−VSUB=0.0 V, and

VB(H)−VSUB=2.5 V, in the case of Nsig=0, $\phi i1(s)$−1.85 V, $\phi i1(m)$−3.62 V, In the case of Nsig=5×10$^{11}$, $\phi i1(s)$=3.63 V, $\phi i1(m)$=4.99 V.

Furthermore, $\phi i2(s)$=4.20 V, $\phi i2(m)$=5.62 V.

Therefore, a barrier $\Delta\phi AB(L)=\phi i2(s)-\phi i1(s)$ (in the case of Nsig=5×10$^{11}$)=4.20 V−3.63 V=0.57 V (see FIG. 12B). When Nsig is~5×10$^{11}$ or less (value close to and less than 5×10$^{11}$), signal charges do not overflow.

Figure 13C:
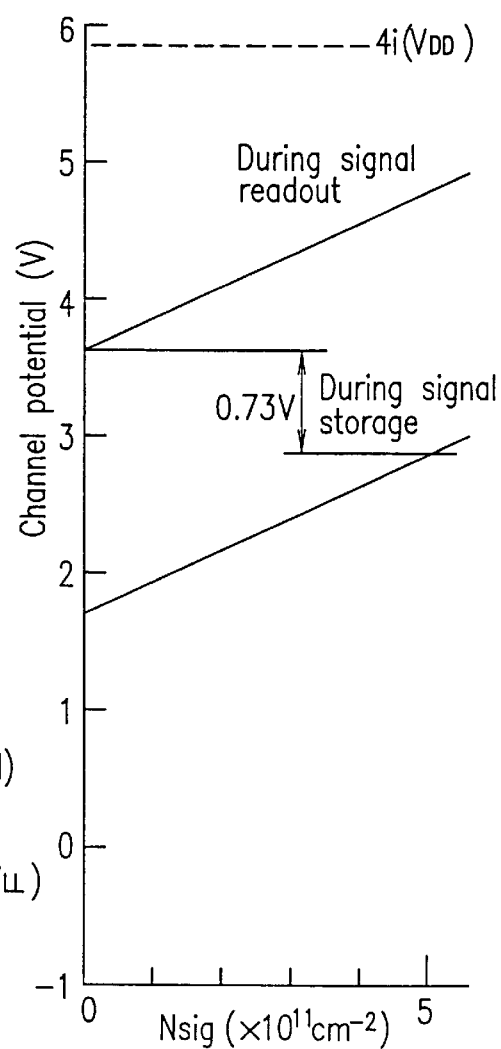
FIG. 13C shows the relationship between a channel potential (V) and signal charges of the amplifying type solid-state imaging device according to Example 8.

Furthermore, since even the minimum channel potential of the well layer 4 is higher than the maximum during signal storage by 0.73 V ($\phi i1(m)$ in the case of Nsig=0−$\phi i1(m)$ in the case of Nsig=5×10$^{11}$)=3.62−2.89 V=0.73 V), it is sufficient to be detected (see FIG. 13C). Therefore, for example, when the signal lines are connected to a voltage supply having the intrinsic level of 3.0 V via a low current load, the gate during signal storage operation is in the OFF state between the drain and the signal lines, and only the gate in signal readout operation is in the ON state. Thus, the channel potential of the well layer 4 corresponding to this gate is detected on the signal line.

EXAMPLE 9

Figure 14A:
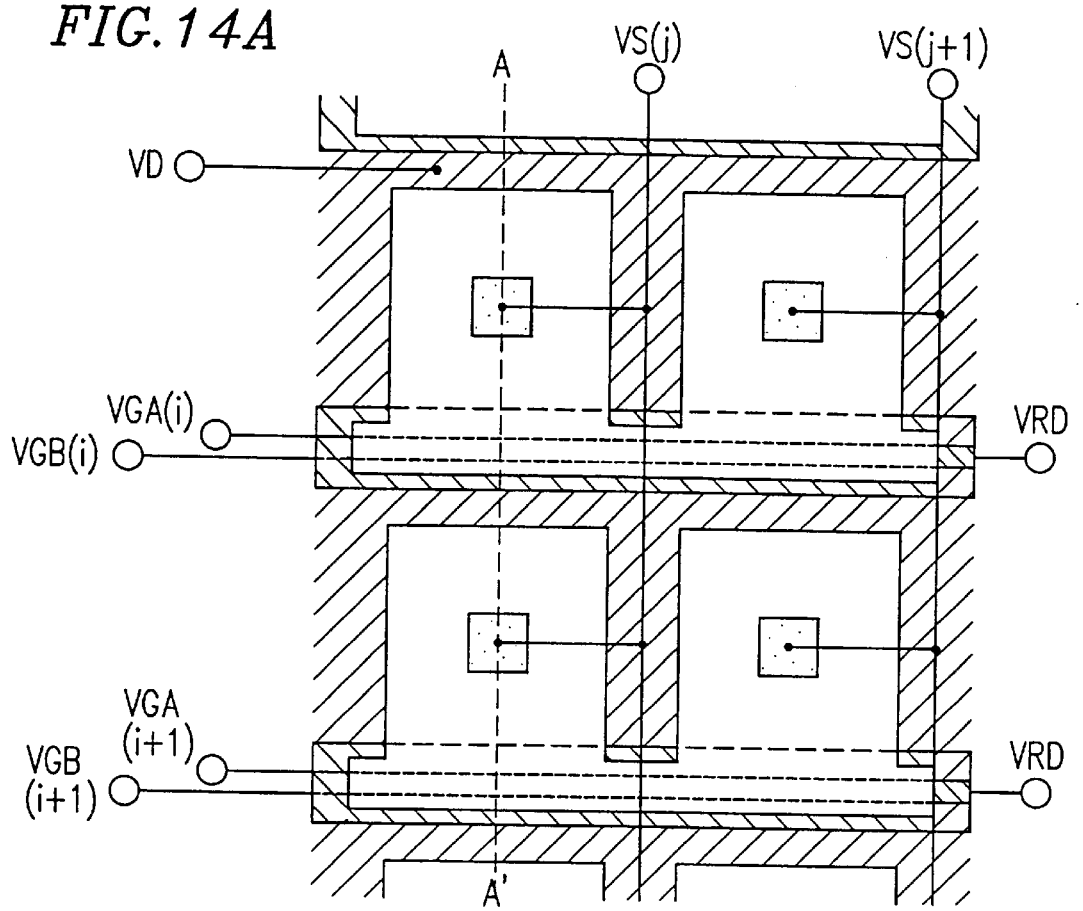
FIG. 14A is a plan view showing an image sensor using the amplifying type solid-state imaging device according to Example 9.

FIG. 14A shows an exemplary two-dimensional image sensor including the amplifying type solid-state imaging device of Example 1. Herein, a first gate region is connected to clock lines indicated by VGA(i), VGA(i+1) or the like commonly in the horizontal direction. A second gate region is also connected to clock lines indicated by VGB(i), VGB (i+1) or the like commonly in the horizontal direction. A second gate electrode 3 is formed below a first gate electrode 2. A source 5 is formed in the middle of the first gate region for each pixel and connected to signal lines indicated by VS(j), VS(j+1) or the like commonly in the vertical direction. A drain 6 is supplied with a drain voltage VD in each pixel periphery from a peripheral section. As a result, in this image sensors the first gate region of the solid-state imaging device is surrounded by the drain 6 in three directions per pixel unit, and the source 5 is formed in a location away from the drain 6. According to such an arrangement, it is only possible to perform reset by forming the second gate region only in a part of the region surrounding the pixel.

The reset drain 8 is formed below the second gate electrode 3. In Example 9, as shown by the dotted lines, the second gate electrode 3 and the reset drain 8 are formed across the entire length in the horizontal direction within the boundaries of the pixels. However, they may be formed in a part thereof. In short, any shape or size can be used, as long as the surface reset channel is obtained.

According to the two-dimensional image sensor of Example 9, the effects of the above-mentioned solid-state imaging device can be attained. More specifically, a compact two-dimensional image sensor with a low power consumption and a high pixel density can be realized. Since a part of the second gate electrode 3 represents the reset drain 8, the second gate electrode 3 is omitted.

EXAMPLE 10

Figure 14B:
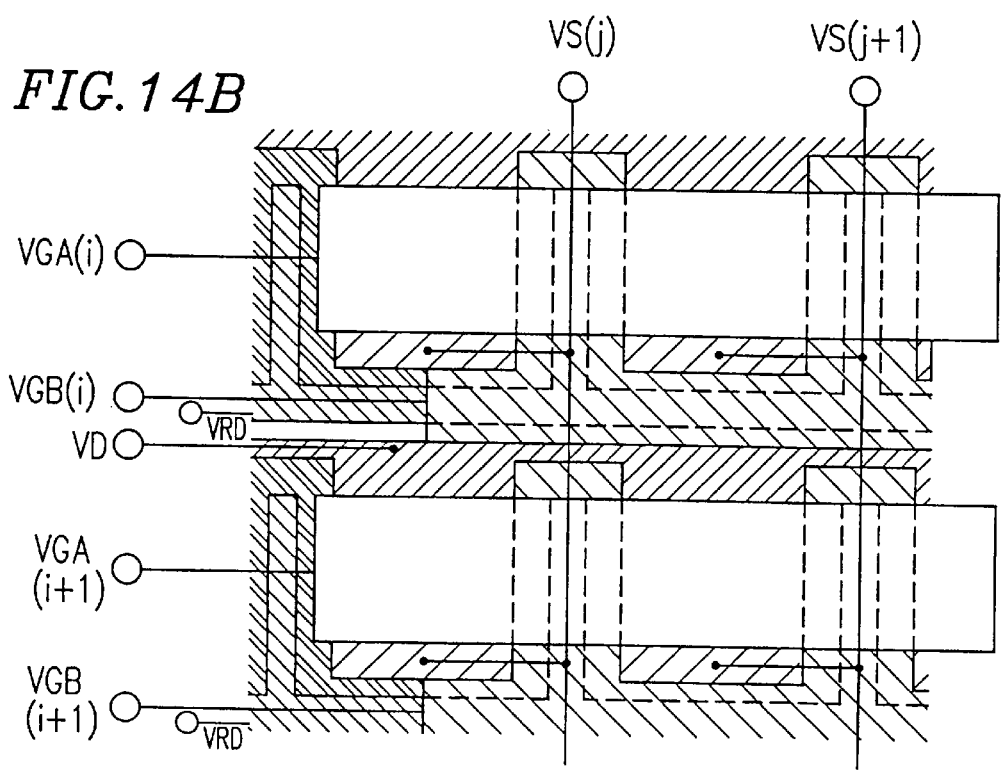
FIG. 14B is a plan view showing another embodiment of the image sensor using the amplifying type solid-state imaging device in Example 10.

FIG. 14B shows another exemplary two-dimensional image sensor including the amplifying type solid-state imaging device of Example 1. Herein, a first gate region is connected to clock lines indicated by VGA(i), VGA(i+1) or the like commonly in the horizontal direction. A second gate region is also connected to clock lines indicated by VGB(i), VGB(i+1) or the like commonly in the horizontal direction.

In Example 10, a second gate electrode 3 is formed in a comb shape, and a reset drain 8 is formed below the second gate electrode 3. A source region 5 is formed in a region surrounded by the first gate region and the second gate region for each pixel and connected to signal lines indicated by VS(j), VS(j+1) or the like commonly in the vertical direction. A drain region 6 is supplied with a drain voltage VD in each pixel periphery from a peripheral section. Also in Example 10 as in the previous example, since a part of the second gate electrode 3 represents the reset drain 8, the second gate electrode 3 is omitted.

In the two-dimensional image sensor of Example 10, the same effects as the two-dimensional image sensor of Example 9 can be obtained.

OTHER EXAMPLES

In the above-mentioned examples, MOS transistors are provided in the first gate region. Alternatively, junction type transistors can be provided instead of the MOS transistors. Furthermore, the structure where the electric potentials of the semiconductor substrate and the reset drains are independently set is not limited to the device of Example 5, but can be applied to other examples. Furthermore, the structure where the first gate region and second gate region differ from each other in the potential distribution is not limited to the device of Example 6, but can be applied to other examples.

As described above, according to the amplifying type solid-state imaging device, since a charge discharge drain is provided, even if a potential ridge occurs, signal charges are released to the drain for charge discharge. Therefore, the constraints associated with for further increases the number of pixels and compactness are eliminated. For this reason, it is possible to realize an increased number of pixels and further compactness of the TGMIS type amplifying type solid-state imaging apparatus, which can operate at a low driving voltage.

Furthermore, by suitably setting the potential barrier of the second gate region, even during the signal storage operation, (1) a blooming suppression function in which excess signal charges are released to the drain for charge discharge, and (2) a shuttering operation function in which all signal charges are only released during a specific period of optical integration, can be provided.

Furthermore, according to the amplifying type solid-state imaging device of the present invention, by suitably selecting a device structure, the semiconductor layer can be formed by an epitaxial growth method. Moreover, the semiconductor layer can be formed on the entire face of the semiconductor substrate by ion implantation without any of the typical limitations of a mask. As a result, a large photoelectric conversion region can be obtained, and the production process is simplified.

According to one embodiment of the amplifying type solid-state imaging device of the present invention, a large photoelectric conversion region can be obtained, thus realizing a high performance amplifying type solid-state imaging apparatus.

Furthermore, according to another embodiment of the amplifying type solid-state imaging device of the present invention, since the potential distribution of the first gate region is different from that of the second gate region, a large photoelectric conversion region can be obtained, thus realizing a high performance amplifying type solid-state imaging apparatus.

Furthermore, according to still another embodiment of the amplifying type solid-state imaging device of the present invention, the electric potentials of the semiconductor substrate and the drain for charge discharge can be independently controlled. Therefore, for example, when the electric potential is set lower than the electric potential of the drain for charge discharge, the potential barrier in the second gate region is eliminated after a reset operation. Thus, a constant charge (offset charge) can be injected into the signal storage region. Therefore, although non-uniformity of gains in pixels, which is a main factor of FPN, is generally large for a low signal amount, this is alleviated by the addition of the offset charges, thus attaining an improved FPN effect. Furthermore, with such a structure, signal charges can be "drawn" by the reset drain via an electric field, so that a high speed reset operation can be realized, thus realizing a high performance solid-state imaging apparatus.

In addition, according to the present invention, it is possible to easily produce the apparatus by a general MOS process.

Various other modifications will be apparent to, and can be readily made by, those skilled in the art without departing from the scope and spirit of this invention. Accordingly, it is not intended that the scope of the claims appended hereto be limited to the description as set forth herein, but rather that the claims be broadly construed.

What is claimed is:

1. An amplifying type solid-state imaging device for storing a signal charge, the device comprising:

a transistor including a first gate region, including a portion in the vicinity of a semiconductor base surface where the signal charge is stored, and a first gate electrode formed on the semiconductor base surface, and a source and a drain which are formed of impurity layers of a higher concentration than the semiconductor base concentration on the semiconductor base surface; and a charge release portion, including a second gate region including the portion in the vicinity of the semiconductor base surface, a part of which is adjacent to the first gate region, and a second gate electrode formed via an insulating film on the semiconductor base surface, and a part of which is adjacent to the first gate electrode, and a drain for charge discharge formed of an impurity layer of a higher concentration than the semiconductor base concentration in a portion having a predetermined distance along the direction of the semiconductor base surface from a portion adjacent to the first gate electrode and the second gate electrode on the semiconductor base surface;

wherein the stored signal charge is released to the drain for charge discharge of the charge release portion.

2. An amplifying type solid-state imaging device according to claim 1, wherein the semiconductor base includes a semiconductor substrate having a first conductivity, and a semiconductor well layer having a second conductivity, formed on a part of the surface of the semiconductor substrate having the first conductivity, the source and the drain having the second conductivity are formed of the impurity layers of a higher concentration than the semiconductor well layer having the second conductivity within the semiconductor well layer having the second conductivity, the first gate electrode is formed between the source and the drain on the semiconductor well layer having the second conductivity, the second gate electrode is formed on the semiconductor substrate having the first conductivity and on a portion where the semiconductor well layer having the second conductivity is not formed, adjacent to the first gate electrode, and the drain for charge discharge, formed of a high concentration impurity layer having the first conductivity, is formed on the semiconductor substrate surface having the first conductivity.

3. An amplifying type solid-state imaging device according to claim 1, wherein the semiconductor base includes a semiconductor substrate having a first conductivity and a semiconductor layer having a second conductivity formed on the semiconductor substrate having the first conductivity, the source and the drain are formed of high concentration impurity layers having the second conductivity on the semiconductor layer having the second conductivity, the first gate electrode is formed between the source and the drain on the semiconductor layer having the second conductivity, a semiconductor well layer having the first conductivity is formed between the source and the drain on a portion adjacent to the first gate region on the surface of the semiconductor layer having the second conductivity, the second gate electrode is formed on the semiconductor well layer having the first conductivity, adjacent to the first gate electrode, and the drain for charge discharge is formed on the semiconductor well layer surface having the first conductivity.

4. An amplifying type solid-state imaging device according to claim 1, wherein the semiconductor base includes a semiconductor substrate having a first conductivity and a semiconductor layer having a second conductivity formed on the semiconductor substrate having the first conductivity, the source and the drain are formed of high concentration impurity layers having the second conductivity on the semiconductor layer having the second conductivity, the first gate electrode is formed between the source and the drain on the semiconductor layer having the second conductivity, the second gate electrode is formed on the semiconductor layer having the second conductivity, adjacent to the first gate electrode, and the drain for charge discharge is formed on the semiconductor layer surface having the second conductivity.

5. An amplifying type solid-state imaging device according to claim 1, wherein the semiconductor base includes a semiconductor substrate having a first conductivity and a semiconductor layer having a second conductivity formed on the semiconductor substrate having the first conductivity, the source and the drain are formed of high concentration impurity layers having the first conductivity on the semiconductor layer having the second conductivity, the first gate electrode constituting the gate region where a signal charge generated by incident light is stored is formed in the vicinity of the surface of the semiconductor layer having the second conductivity between the source and the drain, the second gate electrode is formed on the semiconductor layer having the second conductivity, adjacent to the first gate electrode, and the drain for charge discharge is formed of an impurity layer having the second conductivity on the semiconductor layer surface having the second conductivity.

6. An amplifying type solid-state imaging device according to claim 1, wherein when the first and the second gate electrodes are formed via a gate insulating film and a voltage applied to the first gate electrode is equal to a voltage applied to the second gate electrode, at least one of a thickness of the semiconductor well layer having the second conductivity or the semiconductor layer having the second conductivity, a carrier concentration distribution of the semiconductor well layer having the second conductivity or the semiconductor layer having the second conductivity, and a thickness of the gate insulating film differs in the first gate region and in the second gate region so that a base surface potential in the first gate region is smaller than the base surface potential in the second gate region, and the largest potential in the potential profile of the first gate region is lager than the largest potential in the potential profile of the second gate region.

7. An amplifying type solid-state imaging device according to claim 1, wherein an electrical potential of the semiconductor base is controlled independently of an electrical potential of the drain for charge discharge.

8. An amplifying type solid-state imaging device according to claim 1, wherein the first gate region is surrounded by the drain and the second gate region, and the source is surrounded by the first gate region.

9. An amplifying type solid-state imaging apparatus including the amplifying type solid-state imaging device according to claim 8, wherein the drain and the second gate region function as a device isolation region with respect to a signal charge.

10. An amplifying type solid-state imaging apparatus including the amplifying type solid-state imaging device according to claim 1, wherein the first gate electrode is connected to a first clock line while the second gate electrode is connected to a second clock line, the drain of the transistor is connected to a first power source in common to each imaging device while the drain for charge discharge is connected to a second power source in common to each imaging device, and the source of the transistor is connected to a signal line, the apparatus being a one-dimensional or two-dimensional imaging apparatus.

* * * * *